(12) United States Patent
Hirasawa et al.

(10) Patent No.: US 7,518,287 B2
(45) Date of Patent: Apr. 14, 2009

(54) ACTUATOR FINE MOTION MECHANISM INCLUDING THE ACTUATOR, AND CAMERA MODULE INCLUDING THE FINE MOTION MECHANISM

(75) Inventors: Taku Hirasawa, Kyoto (JP); Hironori Kumagai, Osaka (JP)

(73) Assignee: Panasonic Corporation, Osaka (JP)

( * ) Notice: Subject to any disclaimer, the term of this patent is extended or adjusted under 35 U.S.C. 154(b) by 539 days.

(21) Appl. No.: 10/570,766

(22) PCT Filed: Jun. 7, 2005

(86) PCT No.: PCT/JP2005/010392

§ 371 (c)(1),
(2), (4) Date: Mar. 7, 2006

(87) PCT Pub. No.: WO2005/122380

PCT Pub. Date: Dec. 22, 2005

(65) Prior Publication Data

US 2007/0024715 A1  Feb. 1, 2007

(30) Foreign Application Priority Data

Jun. 7, 2004  (JP) .............................. 2004-167979

(51) Int. Cl.
*H01L 41/08* (2006.01)
(52) U.S. Cl. .................. 310/323.02; 310/328
(58) Field of Classification Search ............ 310/323.02, 310/328, 330
See application file for complete search history.

(56) References Cited

U.S. PATENT DOCUMENTS

| | | | | |
|---|---|---|---|---|
| 5,101,132 A | * | 3/1992 | Yamaguchi | 310/323.16 |
| 5,105,117 A | * | 4/1992 | Yamaguchi | 310/323.16 |
| 5,140,215 A | * | 8/1992 | Yamaguchi | 310/323.16 |
| 5,453,653 A | | 9/1995 | Zumeris | |
| 5,696,421 A | * | 12/1997 | Zumeris et al. | 310/328 |
| 5,877,579 A | * | 3/1999 | Zumeris | 310/323.01 |
| 7,109,639 B2 | * | 9/2006 | Yamamoto et al. | 310/323.16 |
| 7,119,476 B2 | * | 10/2006 | Nagahama | 310/317 |
| 2001/0046107 A1 | | 11/2001 | Irie et al. | |

FOREIGN PATENT DOCUMENTS

| | | |
|---|---|---|
| JP | 5-3688 | 1/1993 |
| JP | 6-104503 | 4/1994 |
| JP | 7-184382 | 7/1995 |
| JP | 2001-309673 | 11/2001 |
| JP | 2001-339967 | 12/2001 |
| JP | 2004-96673 | 3/2004 |
| JP | 2004-348147 | 12/2004 |

* cited by examiner

*Primary Examiner*—Mark Budd
(74) *Attorney, Agent, or Firm*—McDermott Will & Emery LLP

(57) ABSTRACT

In an actuator 11, which includes a driver 10 including: a substrate 1 having a predetermined width and a predetermined length when viewed from the direction of thickness of the substrate; a reinforcing member 2 provided on one of the thickness-wise faces of the substrate 1; and displacement means (a piezoelectric element 3), provided on the other thickness-wise face of the substrate 1, for displacing, with respect to one of the lengthwise ends of the substrate, the other lengthwise end in the direction of width of the substrate, the reinforcing member 2 is configured so that the flexural rigidity thereof in the substrate's width direction is lower than that in the substrate's thickness direction.

23 Claims, 18 Drawing Sheets

FIG. 2
(a) 
(b) 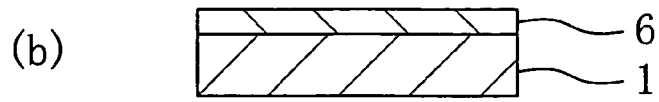
(c) 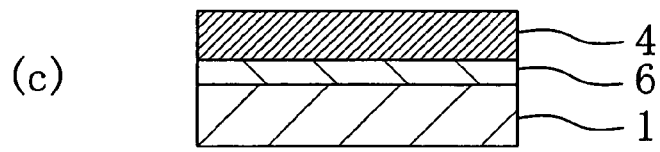
(d) 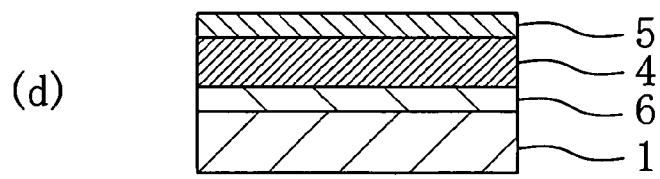
(e) 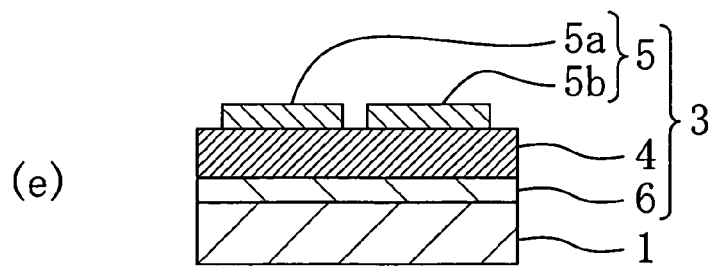
(f) 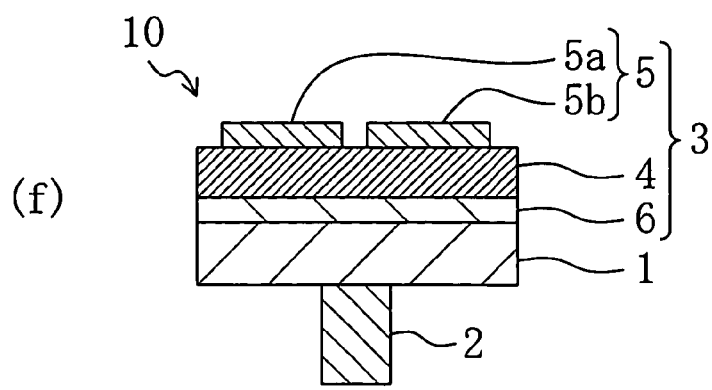

FIG. 5
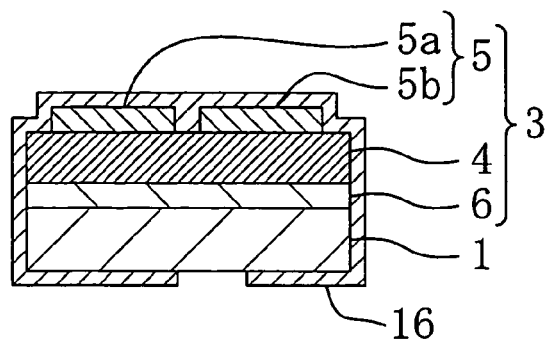
(a)
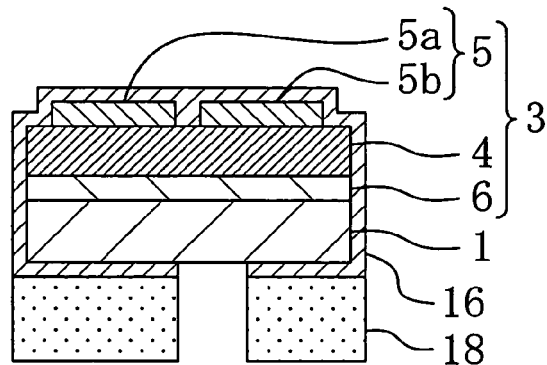
(b)
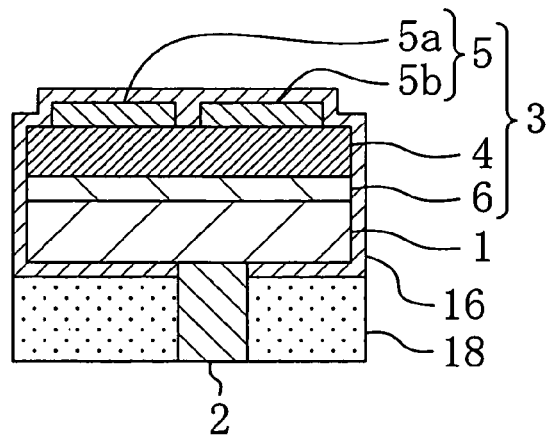
(c)
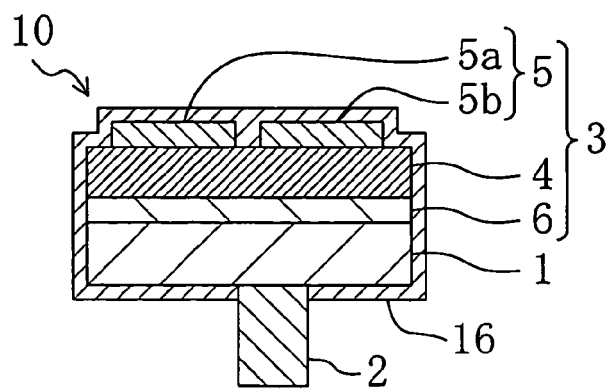
(d)

FIG. 8
(a)
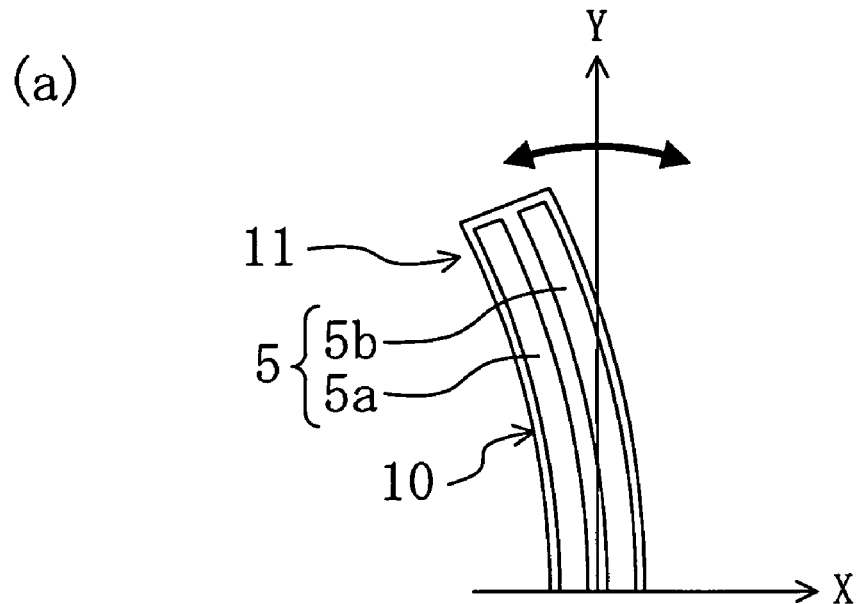
(b)
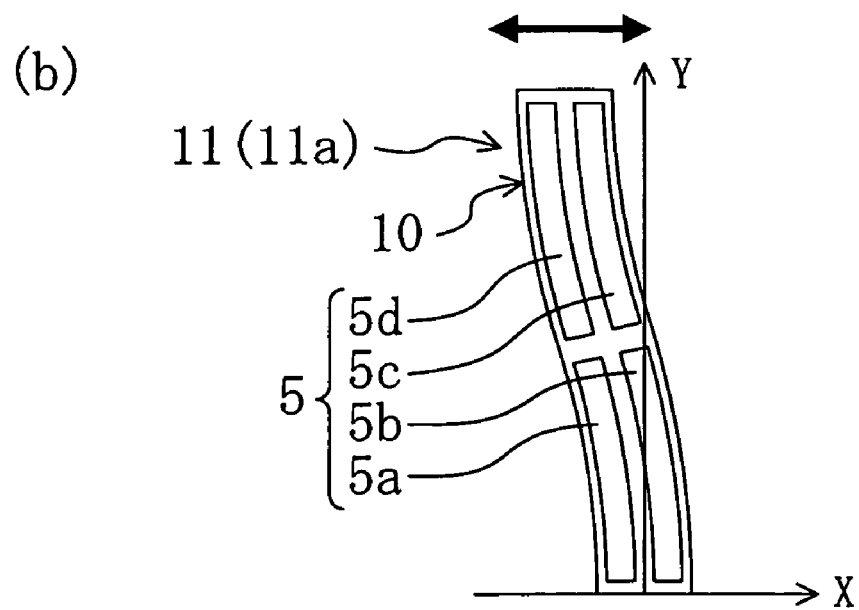

FIG. 9
(a)
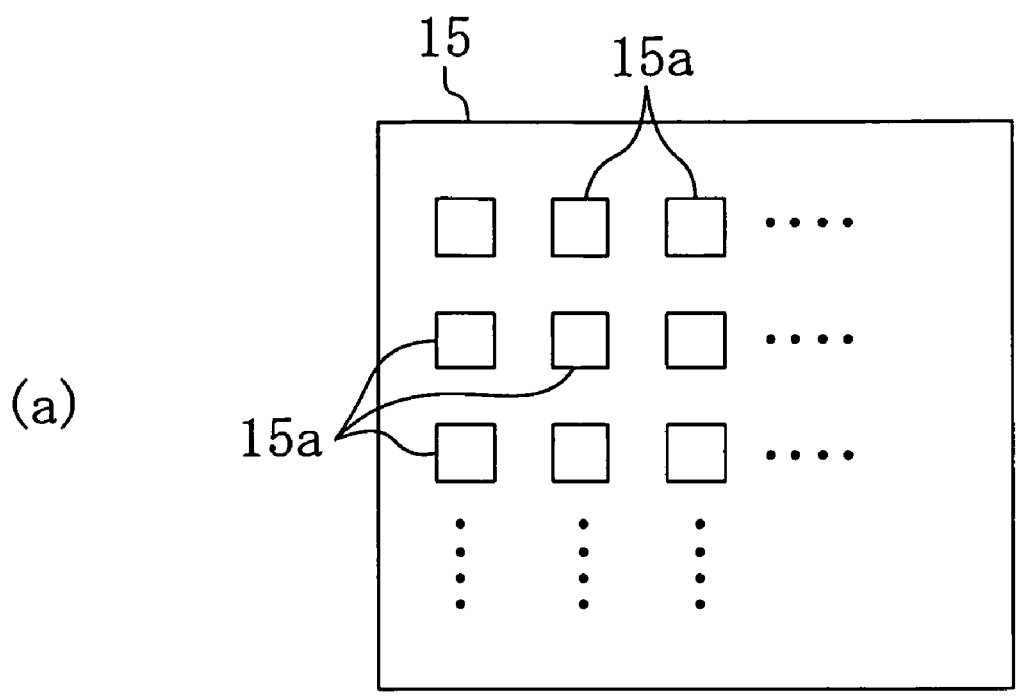
(b)
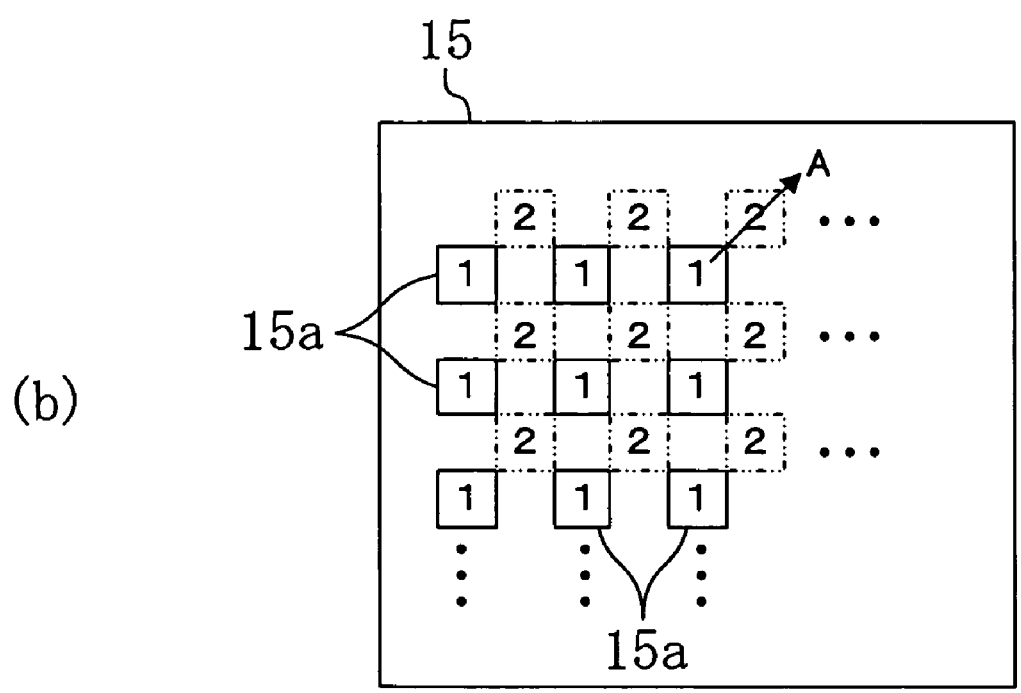

FIG. 12
(a)
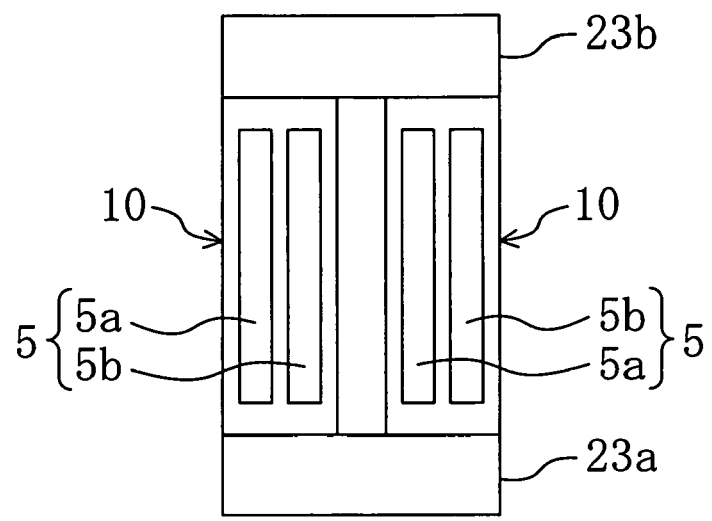
(b)
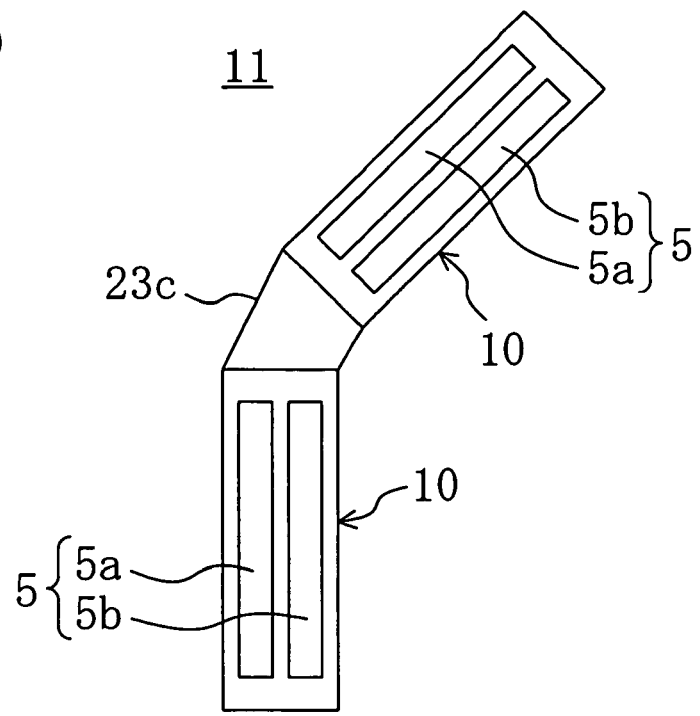

FIG. 13
(a)
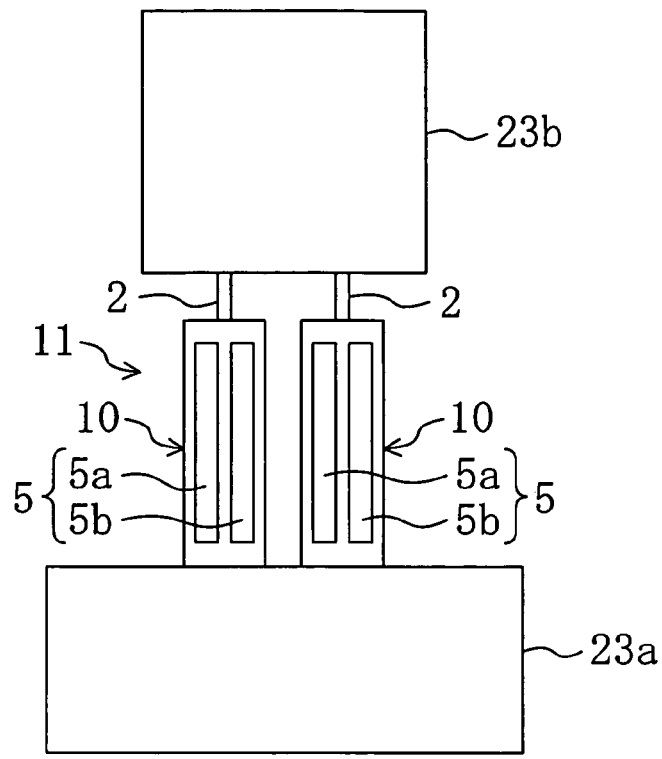
(b)
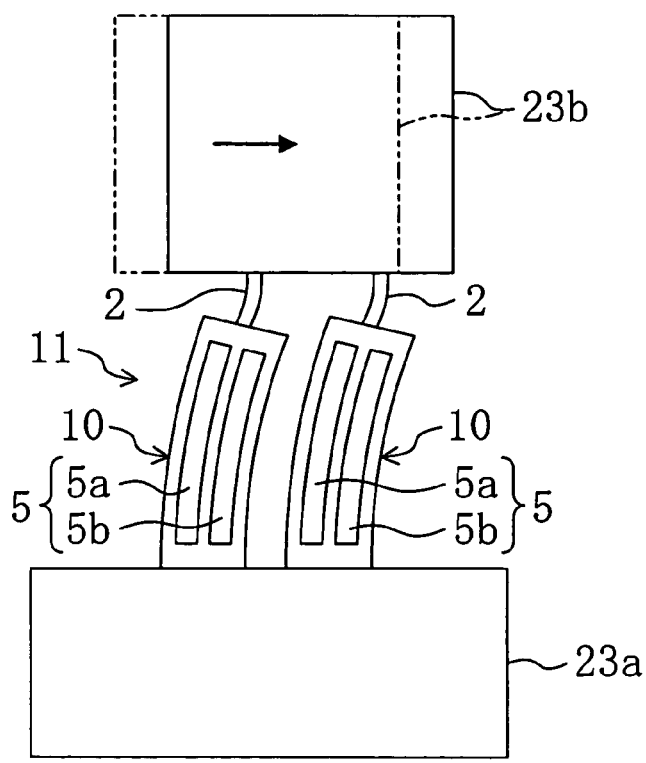

ACTUATOR FINE MOTION MECHANISM INCLUDING THE ACTUATOR, AND CAMERA MODULE INCLUDING THE FINE MOTION MECHANISM

This application is the U.S. National Phase under 35 U.S.C. § 371 of International Application No. PCT/JP2005/010392, filed Jun. 7, 2005, which in turn claims the benefit of Japanese Application No. 2004-167979, filed Jun. 7, 2004, the disclosures of which Applications are incorporated by reference herein in their entirety.

TECHNICAL FIELD

The present invention relates to an actuator including a driver for displacing, with respect to one of the lengthwise ends of a substrate, the other lengthwise end in the direction of width of the substrate; a fine motion mechanism including the actuator so as to move an object slightly; and a camera module including the fine motion mechanism.

BACKGROUND ART

A piezoelectric actuator made of piezoelectric material typically responds quickly and thus can be controlled precisely. One of the applications of such a piezoelectric actuator is a fine motion mechanism for producing fine movement of an object at high speed in a plane (see Patent literature 1, for example). In order to construct such a fine motion mechanism, a piezoelectric actuator 600 shown in FIG. 22, for example, is used. The piezoelectric actuator 600 includes a piezoelectric layer 400 made of platelike piezoelectric material polarized in the direction of thickness (in the Z-axis direction shown in FIG. 22), a first electrode layer 401 formed on one of the thickness-wise faces of the piezoelectric layer 400, and a second electrode layer 402 formed on the other thickness-wise face of the piezoelectric layer 400. The first electrode layer 401 is divided into two individual electrodes 401a and 401b, which are side by side in the direction of width of the piezoelectric layer 400 (in the X-axis direction) and extend in the direction of length of the piezoelectric layer 400 (in the Y-axis direction). When voltages are applied to the piezoelectric layer 400 through the first and second electrode layers 401 and 402, electric fields are applied to the piezoelectric layer 400. At this time, the voltages are applied so that the electric filed 403a (downward in FIG. 22) between the one individual electrode 401a of the first electrode layer and the second electrode layer 402, and the electric filed 403b (upward in FIG. 22) between the other individual electrode 401b of the first electrode layer and the second electrode layer 402 are the same in magnitude but opposite in direction. Consequently, when one side of the piezoelectric layer 400 in the with direction thereof expands in the length direction, the other side contracts in the length direction, whereby with respect to one of the lengthwise ends of the piezoelectric layer 400, the other end is displaced in the width direction (to the contracting side) of the piezoelectric layer 400.

FIG. 23 illustrates a fine motion mechanism constructed using the piezoelectric actuator 600 described above. More specifically, one of the lengthwise end portions of the piezoelectric layer 400 of the piezoelectric actuator 600 is secured to a fixed member 601, while to the other end portion, a movable member 602 is fixed, thereby forming the fine motion mechanism. In this fine motion mechanism, voltages such as mentioned above are applied to the two individual electrodes 401a and 401b to drive the piezoelectric actuator 600, whereby the movable member 602 can be moved slightly in a certain plane with respect to the fixed member 601 in the width direction of the piezoelectric layer 400.

A fine motion mechanism such as described above is used in, e.g., a camera module equipped with an imaging device 500 and an optical lens 501 as shown in FIG. 24, so as to move the imaging device 500 relatively to the optical lens 501 in a plane perpendicular to the optical axis 0 of the optical lens 501, thereby performing a technique (so-called pixel-shifting) in which an image having a higher resolution than that of the imaging device is obtained (see Patent literature 2, for example). In FIG. 24, the reference numeral 502 refers to a holder serving as a movable member for holding the imaging device; 503 to an piezoelectric actuator for moving the holder 502 (the imaging device) in the Y-axis direction in FIG. 24; and 504 to a piezoelectric actuator for moving the holder 502 (the imaging device) in a direction perpendicular to the paper of FIG. 24.

The fine motion mechanism described above is also applicable to a hand-shake-caused-blurring correction mechanism in a camera shown in Patent literature 3. In this hand-shake-caused-blurring correction mechanism, the fine motion mechanism moves the imaging device, the optical lens, and the like so as to cancel hand-shake detected by an angular velocity sensor.

[Patent literature 1] Japanese Laid-Open Publication No. 2001-339967

[Patent literature 2] Japanese Laid-Open Publication No. 2004-96673

[Patent literature 3] Japanese Laid-Open Publication No. 2004-348147

DISCLOSURE OF THE INVENTION

Problem that the Invention is to solve

However, the conventional fine motion mechanism described above has a problem in that the movable member including the imaging device, the optical lens, etc. is supported by the stiffness of the piezoelectric layer, and if the thickness of the piezoelectric layer is small, the stiffness for supporting the movable member becomes insufficient to cause the piezoelectric actuator (the piezoelectric layer) to bend in the direction of thickness of the piezoelectric layer due to the weight of the movable member, and consequently the movable member cannot be moved in the plane in which the movable member should be moved. A possible solution to this problem could be to increase the thickness of the piezoelectric layer so as to increase the stiffness for supporting the movable member. However, if the thickness of the piezoelectric layer is increased, either the driving voltage for the piezoelectric layer or the length of the piezoelectric layer has to be increased so as to ensure a certain amount of movement of the movable member. Furthermore, the thickness of the piezoelectric layer can be increased only to a limited degree, and in the case of a movable member that weighs quite heavy, it becomes difficult to reliably support the movable member.

In particular, in cases in which the above-mentioned fine motion mechanism is used for pixel shifting or hand-shake-caused-blurring correction in the above-described camera module, if the piezoelectric actuators bend in the thickness direction of the piezoelectric layers, the distance between the imaging device and the optical lens is changed to cause the image to become blurred, and the resultant image is not sharp.

In view of the above problem, the present invention has been made, and an object of the present invention is to improve the configuration of the actuators for producing fine movement of the movable member including the imaging device and the optical lens, etc. in a certain plane, so that the movable member is reliably supported to thereby suppress displacement of the movable member from the plane in which the movable member should be moved.

Means for Solving the Problem

In order to accomplish the above object, the present invention achieves separation between the function of moving a movable member and the function of supporting the movable member. To be specific, a substrate and a reinforcing member function to support a movable member, while displacement means, such as a piezoelectric element, for displacing, with respect to one of the lengthwise ends of the substrate, the other end in the direction of width of the substrate functions to move the movable member. And the reinforcing member is configured so that its flexural rigidity is lower in the substrate's width direction than in the substrate's thickness direction, whereby the reinforcing member is more likely to bend in the substrate's width direction than in the substrate's thickness direction.

Specifically, the first invention is directed to an actuator which includes a driver including: a substrate having a predetermined width and a predetermined length when viewed from a thickness direction of the substrate; a reinforcing member provided on one of the thickness-wise faces of the substrate; and displacement means, provided on the other thickness-wise face of the substrate, for displacing, with respect to one of the lengthwise ends of the substrate, the other lengthwise end in a width direction of the substrate.

And the reinforcing member is configured so that the flexural rigidity thereof in the substrate's width direction is lower than that in the substrate's thickness direction.

By this structure, it is possible to freely change the flexural rigidity of the substrate in the direction of thickness of the substrate including the reinforcing member and the flexural rigidity thereof in the direction of width by changing the configuration of the reinforcing member. And, the reinforcing member is configured so that the flexural rigidity thereof is lower in the substrate's width direction than in the substrate's thickness direction, whereby the widthwise flexural rigidity of the substrate including the reinforcing member is made almost equal to that obtained in a case where no reinforcing member is provided, so that widthwise displacement of the substrate by the displacement means is not prevented. On the other hand, the flexural rigidity of the substrate in the direction of thickness of the substrate including the reinforcing member can be made higher than that obtained in a case where no reinforcing member is provided, whereby bending of the substrate in the thickness direction can be suppressed. As a result, it is possible for the substrate to be smoothly displaced in the direction of its width by the displacement means, while the substrate is not likely to deform (bend) in the direction of its thickness, even if the substrate supports a movable member. Therefore, when one of the end portions of the driver in the substrate's length direction is secured to a fixed member and a movable member is secured to the other end portion so as to construct a fine motion mechanism for moving (producing fine movement of) the movable member, it is possible to effectively suppress displacement of the movable member from the plane in which the movable member should move. Consequently, it is possible to reliably move (produce fine movement of) the movable member in the predetermined plane.

According to the second invention, in the first invention on the one thickness-wise face of the substrate, the reinforcing member is provided continuously in a length direction of the substrate.

Then, deformation of the substrate in the thickness direction is suppressed more effectively. Therefore, when a fine motion mechanism is constructed using this actuator, it is possible to move a heavier movable member.

According to the third invention, in the first invention the reinforcing member is provided on the one thickness-wise face of the substrate in approximately the center in the width direction.

Then, the flexural rigidity of the substrate including the reinforcing member to one side of the width direction is made almost equal to the flexural rigidity to the other side. This facilitates the disposition of the means for deforming the substrate in the width direction, whereby the actuator can be controlled precisely. Therefore, when a fine motion mechanism is constructed using this actuator, it is possible to control the movement of the movable member more precisely.

According to the fourth invention, in the first invention the reinforcing member is made of metal material.

Then, by the use of metal material having high ductility in forming the reinforcing member, the shock resistance characteristics of the actuator are improved. Therefore, when a fine motion mechanism is constructed using this actuator, the stiffness for supporting the movable member is increased, and in addition, the shock resistance characteristics of the actuator are improved.

According to the fifth invention, in the fourth invention the reinforcing member is made of plating material.

Then, if a mold made of non-metallic material is formed on the substrate and then the reinforcing member is formed by plating using this mold, the reinforcing member having a fine structure can be formed easily. This formation method also allows the configuration accuracy and mounting accuracy of the reinforcing member to be increased, while permitting the adhesion of the reinforcing member to the substrate to be increased. Therefore, when a fine motion mechanism is constructed using this actuator, it is possible to control the movement of the movable member more precisely, and the reliability in long-term operation is also increased.

According to the sixth invention, in the fifth invention a nucleation-facilitating-material containing layer is formed between the reinforcing member and the substrate, the nucleation-facilitating-material containing layer containing material for facilitating, when the reinforcing member is formed of plating on the substrate, nucleation for growth of the plating.

Then, even if the substrate is made of non-metallic material, the reinforcing member made of plating material can be easily formed on the substrate. This enables the substrate and the reinforcing member to be connected firmly, thereby improving the long-term operation characteristics, shock resistance characteristics, etc. of the actuator. In particular, if Fe, Ni, Pd, or the like, which catalyzes an electroless plating solution, is used as the material for facilitating the nucleation, the reinforcing member made of the electroless plating material can be easily formed on the non-metallic substrate.

According to the seventh invention, in the fourth invention the periphery of the driver except for the reinforcing member is covered with non-metallic material.

Then, when the reinforcing member is formed by plating, it is possible to prevent formation of the plating on portions that require no plating, so that the reinforcing member can be efficiently formed by plating. In addition, the driver of the actuator can be protected by the non-metallic material.

According to the eighth invention, in the first invention the substrate is made of metal material.

Then, by the use of metal material having high ductility in forming the substrate, the shock resistance characteristics of the actuator are improved. Also, since metal material is conductive, it is possible to directly form the reinforcing member on the substrate by electroplating. Moreover, if the substrate and the reinforcing member are both made of metal material, the reliability of the actuator is also increased, because the adhesion between metals is good. Therefore, when a fine motion mechanism is constructed using this actuator, the movement accuracy of the movable member is increased, and the shock resistance characteristics of the actuator are improved.

According to the ninth invention, in the first invention the reinforcing member is formed integral with the substrate.

Then, the accuracy of position of the reinforcing member with respect to the substrate is increased, while the reinforcing member is never separated from the substrate. Therefore, when a fine motion mechanism is constructed using this actuator, the positioning accuracy of the movable member and the reliability in long-term operation are increased.

According to the tenth invention, in the first invention when an average value of the dimension of the reinforcing member in the substrate's width direction is $\alpha$ times an average value of the width of the substrate, and an average value of the dimension of the reinforcing member in the substrate's thickness direction is $\beta$ times an average value of the thickness of the substrate, the values of $\alpha$ and $\beta$ satisfy all of the following expressions:

$0.05 < \alpha < 0.45$, $1 < \beta < 10$, and $0.001 < \alpha^3 \beta < 0.1$

This provides a most suitable reinforcing member that is capable of reliably suppressing deformation of the substrate in the thickness direction without preventing widthwise displacement of the substrate by the displacement means.

According to the eleventh invention, in the first invention the width of the substrate is made to be from more than one to not more than twenty times the thickness of the substrate, and the length of the substrate is made to be equal to, or more than, four times the width of the substrate.

Then, it is possible to take energy out of the displacement means in the most efficient manner, whereby the substrate is efficiently displaced in the width direction, while it is also ensured that the amount of the displacement is sufficiently large.

According to the twelfth invention, in the first invention the displacement means includes a piezoelectric layer, a first electrode layer provided on one of the thickness-wise faces of the piezoelectric layer, and a second electrode layer provided on the other thickness-wise face of the piezoelectric layer; and at least one of the first and second electrode layers is divided into two or more individual electrodes so that electric fields for displacing the other lengthwise end of the substrate with respect to the one lengthwise end in the width direction of the substrate can be applied to the piezoelectric layer.

Then, the displacement means can be configured easily. Also, in conventional actuators, the movable member has to be supported by a piezoelectric layer, but in this actuator, it is not necessary to do so. Therefore, the piezoelectric layer can be reduced in thickness, thereby enabling the piezoelectric element to be driven at low voltage. Therefore, when a fine motion mechanism is constructed using this actuator, it is possible to suppress deformation of the substrate in the thickness direction and move the movable member in the width direction of the substrate at low voltage.

According to the thirteenth invention, in the twelfth invention at least one of the first and second electrode layers is divided into four or more individual electrodes.

Then, when a fine motion mechanism is constructed using this actuator, it is possible to move the movable member at low voltage, and in addition, it is also possible to finely deform the substrate in the width direction, thereby increasing the degree of freedom of movement of the movable member.

According to the fourteenth invention, in the twelfth invention all of the individual electrodes have substantially the same surface area.

Then, if voltages applied to the individual electrodes are equal to each other, the electric fields applied to the portions of the piezoelectric layer that correspond to the respective individual electrodes become equal in magnitude. Therefore, when a fine motion mechanism is constructed using this actuator, it becomes easy to control the movement of the movable member, while the configuration of driving circuits that apply the voltages to the individual electrodes is simplified.

According to the fifteenth invention, in the twelfth invention at least one of the first and second electrode layers is divided into two individual electrodes which are arranged in the substrate's width direction; and an electric field applied to a portion of the piezoelectric layer that corresponds to one of the two individual electrodes, and an electric field applied to a portion of the piezoelectric layer that corresponds to the other individual electrode are different in magnitude.

Then, it is possible to deform the substrate not only in the width direction but also in the thickness direction. Therefore, in a fine motion mechanism constructed using this actuator, even if the substrate is bent in the thickness direction by the weight of the movable member, the displacement means can be operated so as to cancel the bending, thereby suppressing displacement of the movable member from the plane in which the movable member should be moved. In this way, since any thickness-wise bending of the substrate can be corrected, it is also possible to construct a fine motion mechanism in which a heavier movable member can be supported without any problems and the movable member is moved not only in the substrate's width direction but also in the substrate's thickness direction.

According to the sixteenth invention, in the twelfth invention at least one of the first and second electrode layers is divided into four individual electrodes, which are arranged two by two in the substrate's width direction and in the substrate's length direction so as to be respectively located at the vertices of a rectangle when viewed from the thickness direction of the substrate; and electric fields applied to portions of the piezoelectric layer that correspond to two of the individual electrodes located respectively at two vertices of opposite angles of the rectangle are equal in magnitude to each other, and electric fields applied to portions of the piezoelectric layer that correspond to the other two individual electrodes located respectively at the other two vertices are also equal in magnitude to each other.

Then, the movable member describes a line as it is moved, and this invention is therefore effective when the movable member is required to be precisely moved along a line.

According to the seventeenth invention, in the sixteenth invention the magnitude of the electric fields applied to the portions of the piezoelectric layer that correspond to the two of the individual electrodes located respectively at the two vertices of the opposite angles of the rectangle is different from the magnitude of the electric fields applied to the portions of the piezoelectric layer that correspond to the other two individual electrodes located respectively at the other two vertices.

Then, in addition to the fact that the movable member can be moved along a line, it becomes possible to deform the substrate not only in the width direction but also in the thickness direction, as in the fifteenth invention.

According to the eighteenth invention, in the first invention the actuator includes a plurality of drivers in which faces of substrates, on which reinforcing members have been provided, face in the same direction and are arranged in parallel with each other in the substrates' width direction, wherein the plurality of drivers are connected in parallel with each other at their both end portions in the substrates' length direction.

More specifically, in the case of a single driver, in order to increase the amount of movement of the movable member, the width of the substrate has to be reduced to thereby increase the amount of widthwise displacement of the substrate. Nevertheless, if the width of the substrate is reduced, the widthwise flexural rigidity of the substrate becomes too low to cause the widthwise resonance characteristics of the substrate to deteriorate. As a result, even if an attempt were made to operate the driver at high speed by changing the applied voltages at high speed or the like, deformation of the substrate would not immediately follow the changes of the voltages, such that the high-speed movement of the movable member would be difficult. In contrast, in the inventive configuration, it is possible to increase the amount of widthwise displacement of the substrate, while the movable-member-supporting characteristics and the widthwise resonance characteristics of the substrate are made equal to those obtained in the case of a single driver. As a result, in a fine motion mechanism, in which at least one of the drivers is fixed at its one end portion in the substrate's length direction to a fixed member, and a movable member is secured to the at least one driver at the other end portion of the driver in the substrate's length direction, the movable member can be moved at higher speed and the amount of movement of the movable member can be increased, as compared with the case of a single driver. Furthermore, if the plurality of drivers are made to have the same deformation characteristics, it becomes possible to move the movable member along a line.

According to the nineteenth invention, in the first invention the actuator includes a plurality of drivers in which faces of substrates, on which reinforcing members have been provided, face in the same direction, wherein the plurality of drivers are connected in serial with each other at their end portions in the substrates' length direction.

More specifically, in a fine motion mechanism, in which, of a plurality of drivers connected in series, one of the endmost drivers is secured at an end portion thereof, which is not connected with any other driver, to a fixed member, while a movable member is secured to an end portion of the other endmost driver which is not connected with any other driver, the degree of freedom of movement of the movable member and the amount of movement of the movable member can be increased as compared with the case of a single driver, but there is a problem in that the movable member is likely to be displaced from the plane in which the movable member should be moved. Nevertheless, in this invention, since the reinforcing members increase the flexural rigidity of the substrates in the thickness direction, it is possible to effectively suppress displacement of the movable member from the plane in which the movable member should be moved. Consequently, while the movable member is reliably moved in the predetermined plane, the degree of freedom of movement of the movable member and the amount of movement of the movable member can be increased.

According to the twentieth invention, in the nineteenth invention two adjacent drivers extend in directions perpendicular to each other when viewed from the substrates' thickness direction.

By this structure, it is possible to freely move the movable member in the two perpendicular axial directions in the plane in which the movable member should be moved, and in addition, the driver extending in one of the axial directions can control movement of the movable member in the other axial direction, and the driver extending in the other axial direction can control movement of the movable member in the one axial direction, whereby the positioning of the movable member can be controlled easily.

According to the twenty-first invention, in the nineteenth invention the plurality of drivers, which are arranged in parallel with each other in the substrates' width direction, are connected in series with each other at their end portions in the substrates' length direction via a connecting member.

Then, the amount of movement of the movable member is made equal to the total amount of displacements of all drivers in the substrate's width direction, thereby enabling the amount of movement of the movable member to be increased significantly as compared with the case of a single driver. As a result, this actuator is suitably used in a fine motion mechanism, in which a movable member is required to be moved by a large amount, e.g., in a hand-shake-caused-blurring correction mechanism.

The twenty-second invention is a fine motion mechanism which includes an actuator including a driver for moving a movable member with respect to a fixed member. According to this invention, the driver of the actuator includes a substrate having a predetermined width and a predetermined length when viewed from a thickness direction of the substrate; a reinforcing member provided on one of the thickness-wise faces of the substrate; and displacement means, provided on the other thickness-wise face of the substrate, for displacing, with respect to one of the lengthwise ends of the substrate, the other lengthwise end in a width direction of the substrate; the reinforcing member is configured so that the flexural rigidity thereof in the substrate's width direction is lower than that in the substrate's thickness direction; one end portion of the driver in the substrate's length direction is secured to the fixed member, while to the other end portion, the movable member is secured; and the driver is configured so as to move the movable member with respect to the fixed member in the substrate's width direction by operating the displacement means.

This invention makes it possible to suppress deformation of the driver caused by the weight of the movable member in a direction (the substrate's thickness direction) that is different from the direction (the substrate's width direction) in which the driver should be deformed, whereby the movable member is moved reliably in a certain plane. Also, if the movable member is supported by two or more drivers, the deformation of the substrate in the thickness direction can be suppressed further.

The twenty-third invention is a camera module which includes an imaging device, an optical lens for guiding light to the imaging device, and an actuator including a driver for moving the imaging device or the optical lens in a direction perpendicular to the optical axis of the optical lens.

According to this invention, the driver of the actuator includes a substrate having a predetermined width and a predetermined length when viewed from a thickness direction of the substrate; a reinforcing member provided on one of the thickness-wise faces of the substrate; and displacement means, provided on the other thickness-wise face of the substrate, for displacing, with respect to one of the lengthwise ends of the substrate, the other lengthwise end in a width direction of the substrate; the reinforcing member is configured so that the flexural rigidity thereof in the substrate's width direction is lower than that in the substrate's thickness direction; one end portion of the driver in the substrate's length direction is secured to a fixed member, while to the other end portion, the imaging device or the optical lens is secured; and the driver is configured so as to move the imaging device or the optical lens with respect to the fixed member in a direction perpendicular to the optical axis of the optical lens by operating the displacement means.

This inventive camera module includes a fine motion mechanism similar to that of the twenty-second invention. Therefore, a compact and lightweight camera module that provides high-quality high-resolution images is realized.

Effects of the Invention

In the actuators of this invention, a substrate and a reinforcing member, instead of displacement means, have the function of supporting a movable member, and the reinforcing member is configured so that its flexural rigidity is lower in the substrate's width direction than in the substrate's thickness direction, whereby deformation of the substrate (the driver) in its thickness direction is suppressed without preventing widthwise displacement of the substrate by the displacement means. Therefore, where the inventive actuators are used to construct a fine motion mechanism, the movable member is reliably moved in a certain plane. Also, in cases where the displacement means is formed of a piezoelectric element or the like, the driving voltage for the piezoelectric element can be lowered by reducing the thickness of the piezoelectric layer, while the movable member is reliably supported by the substrate and the reinforcing member, even if the thickness of the piezoelectric layer is reduced. Therefore, reduction in the driving voltage and the supporting of the movable member are both achieved. As a result, it is possible to reduce the size of, and the driving voltage for, the actuators (and hence the fine motion mechanism, the camera module using this fine motion mechanism, and the like).

BRIEF DESCRIPTION OF THE DRAWINGS

FIG. 2 schematically illustrates a method for fabricating the actuator.

FIG. 5 schematically indicates how to form a reinforcing member of a driver in an actuator according to Example 6.

FIG. 8 is a plan view illustrating how an actuator deforms when operated. FIG. 8(a) indicates a case in which a first electrode layer is divided into two, while FIG. 8(b) indicates a case in which the first electrode layer is divided into four.

FIG. 9(a) is an enlarged plan view of an imaging device, while FIG. 9(b) schematically illustrates how the positions of photoreceptors vary when a high-resolution image having twice as many pixels is obtained by using a fine motion mechanism in which the imaging device is moved in a single axial direction.

FIG. 12 illustrates actuators according to a fifth embodiment. FIG. 12(a) illustrates a case in which two drivers are connected in parallel with each other, while FIG. 12(b) illustrates a case in which two drivers are connected in series with each other.

FIG. 13(a) is a view illustrating an actuator according to Example 11, and (b) is a view illustrating how drivers of the actuator deform when operated.

Figure 1:
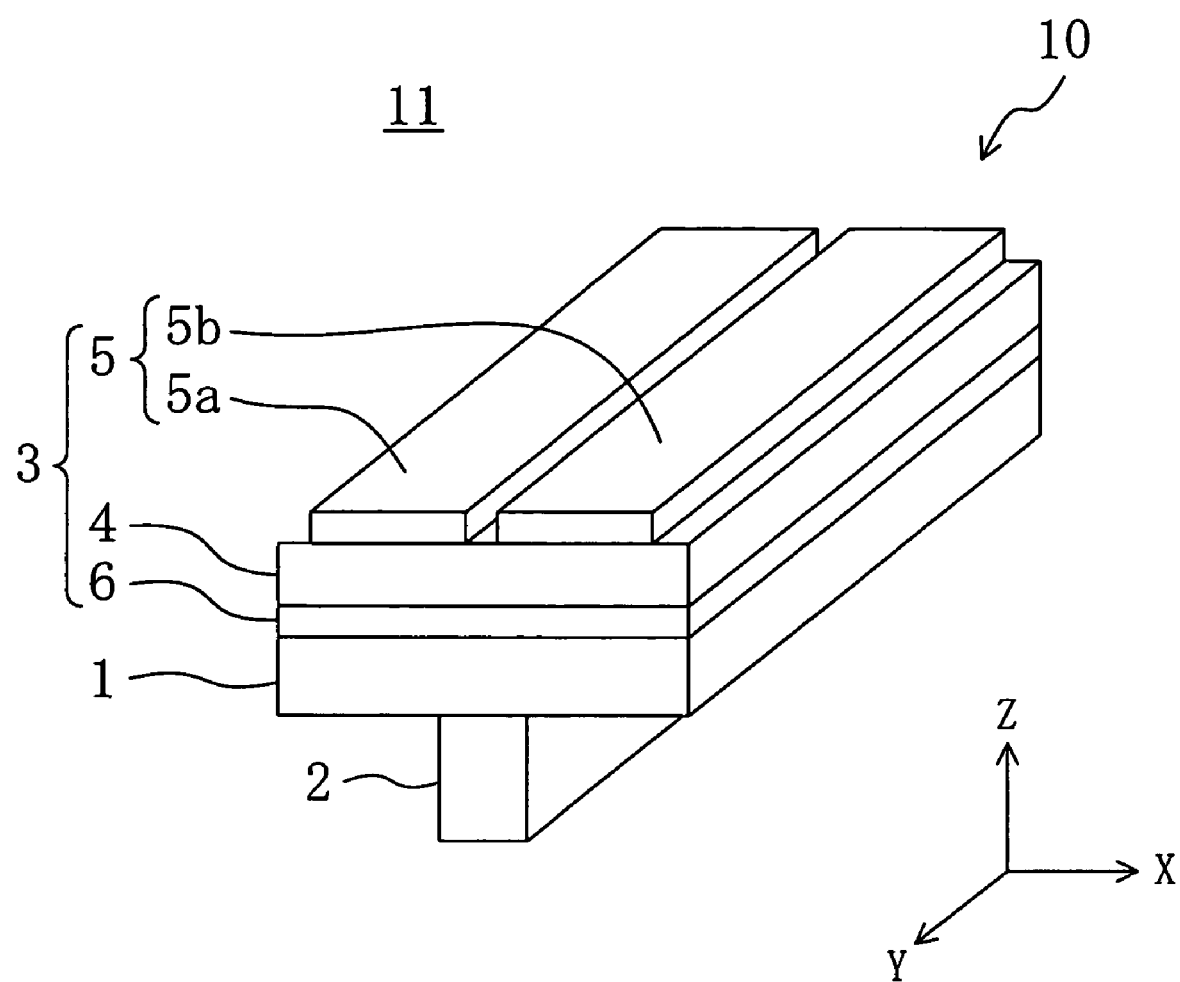
FIG. 1 is an oblique view illustrating an actuator according to a first embodiment of the present invention.

| Explanation of the Reference Characters | |
|---|---|
| 1 | Substrate |
| 2 | Reinforcing member |
| 3 | Piezoelectric element (displacement means) |
| 4 | Piezoelectric layer |
| 5 | First electrode layer |
| 6 | Second electrode layer |
| 7 | Optical lens |
| 10 | Driver |
| 11 | Actuator |
| 12 | Fixed member |
| 13 | Movable member |
| 15 | Imaging device |

BEST MODE FOR CARRYING OUT THE INVENTION

Hereinafter, embodiments of the present invention will be described in detail with reference to the accompanying drawings.

First Embodiment

FIG. 1 illustrates an actuator 11 according to a first embodiment of the present invention. The actuator 11 includes a driver 10 which has a rectangular substrate 1 having a predetermined width and a predetermined length when viewed from the direction of thickness (i.e., the Z-axis direction (the vertical direction) shown in FIG. 1). The width of the substrate 1 (the dimension in the X-axis direction) is preferably made to be from more than one to not more than twenty times the thickness of the substrate 1, and the length of the substrate 1 (the dimension in the Y-axis direction) is preferably set equal to, or more than, four times the width. When the substrate 1 is displaced in the width direction as will be described below, the width and length thus set allow efficient widthwise displacement of the substrate 1 without twisting of the substrate 1, while ensuring that the amount of displacement is sufficiently large.

In this embodiment, the width and thickness of the substrate 1 are constant in the direction of entire length, but they may be varied according to the positions in the length direction, or the substrate 1 may be curved in the direction of its width. Also, the substrate 1 may be a glass substrate, a silicon substrate, a metal substrate, a ceramic substrate, or the like. The operating characteristics and impact resistance characteristics of the actuator 11 vary depending upon the characteristics of the material of the substrate 1. A metal substrate is particularly desirable, because it improves the impact resistance characteristics of the actuator 11.

The driver 10 further includes a reinforcing member 2 and a piezoelectric element 3. The reinforcing member 2 is provided on one of the thickness-wise faces (the lower face in this embodiment) of the substrate 1. The piezoelectric element 3 is provided on the other thickness-wise face (the upper face in this embodiment) of the substrate 1 and serves as displacement means for displacing, with respect to one of the lengthwise ends of the substrate 1, the other lengthwise end in the direction of width of the substrate 1.

The piezoelectric element 3 is composed of a piezoelectric layer 4, a first electrode layer 5, and a second electrode layer 6. The piezoelectric layer 4 has substantially the same shape as the substrate 1 when viewed from the direction of thickness of the substrate 1, and is polarized in the thickness direction. The first electrode layer 5 is provided on one of the thickness-wise faces of the piezoelectric layer 4 (i.e., the face (the upper face) opposite the substrate 1 in this embodiment). The second electrode layer 6 is provided on the other thickness-wise face (the face (the lower face) closer to the substrate 1 in this embodiment) of the piezoelectric layer 4. In this manner, the piezoelectric element 3 is configured so that voltages can be applied to the piezoelectric layer 4 through the first and second electrode layers 5 and 6. The piezoelectric layer 4 is made of lead zirconate titanate (the composition ratio between Zr and Ti is Zr/Ti=53/47) in this embodiment. However, the piezoelectric material and the composition thereof are not limited to these, but any piezoelectric material of any composition may be used, so long as when electric fields are applied to the piezoelectric layer 4 by application of voltages to the first and second electrode layers 5 and 6, the piezoelectric layer 4 is expanded and contracted by the piezoelectric effect in a direction (in the direction of length of the piezoelectric layer 4) perpendicular to the direction of the electric fields.

The first electrode layer 5 is divided into two individual electrodes 5a and 5b, which are side by side in the direction of width of the piezoelectric layer 4 (in the X-axis direction) and extend in the direction of length of the piezoelectric layer 4 (in the Y-axis direction). These two individual electrodes 5a and 5b are disposed in positions that are symmetric about the midline of the piezoelectric layer 4 in the width direction, and thus have the same surface area. On the other hand, the second electrode layer 6 has substantially the same shape as the substrate 1 and the piezoelectric layer 4, when viewed from the direction of thickness of the substrate 1, and serves as a common electrode. The piezoelectric element 3 is configured in such a manner that voltages are applied to the first and second electrode layers 5 and 6 so that electric fields for displacing, with respect to one of the lengthwise ends of the substrate 1, the other lengthwise end in the direction of width of the substrate 1 are applied to the piezoelectric layer 4. More specifically, voltages are applied to the first and second electrode layers 5 and 6 so that in the piezoelectric layer 4, an electric field applied to the portion (the portion between the individual electrode 5a and the second electrode layer 6) corresponding to the one individual electrode 5a, and an electric field applied to the portion (the portion between the individual electrode 5b and the second electrode layer 6) corresponding to the other individual electrode 5b are the same in magnitude but different in direction.

As a result of the voltage application described above, lengthwise expansion/contraction in the piezoelectric layer 4 in the portion of the piezoelectric layer 4 between the one individual electrode 5a and the second electrode layer 6, and in the portion between the other individual electrode 5b and the second electrode layer 6 are opposite. That is, when one side of the piezoelectric layer 4 in the width direction thereof expands lengthwise, the other side contracts lengthwise. At this time, the substrate 1 does not expand/contract, thereby producing a force for bending the substrate 1 in the thickness direction. This force is downward in the expanding portion of the piezoelectric layer 4, while being upward in the contracting portion. Therefore, in the entire driver 10, the downward force and the upward force cancel each other out in the vertical direction, such that the substrate 1 does not deform in the vertical direction. As a result, the lengthwise expanding force and the lengthwise contracting force in the piezoelectric layer 4 cause the substrate 1 (the entire driver 10) to bend (elastic deformation) in the direction of width of the substrate 1, whereby with respect to one of the lengthwise ends of the substrate 1, the other end is displaced in the width direction of the substrate 1 (to the contracting side). Strictly speaking, as will be described below in a fourth embodiment, the other lengthwise end of the substrate 1 is displaced with respect to the one lengthwise end while describing an arc as its trajectory (i.e., rotated about an axis extending in the vertical direction), thereby producing a lengthwise displacement of the substrate 1 in addition to the widthwise displacement of the substrate 1. Nevertheless, the amount of the lengthwise displacement is very small as compared with the widthwise displacement, and thus causes no problems except in special cases.

The second electrode layer 6 does not need to be formed on the entire lower face of the piezoelectric layer 4. Like the first electrode layer 5, the second electrode layer 6 may be divided into two individual electrodes, and these individual electrodes may be disposed on parts of the lower face of the piezoelectric layer 4, which respectively correspond to the two individual electrodes 5a and 5b of the first electrode layer 5. According to the fabrication method that will be described later, in cases where the second electrode layer 6 is divided into a plurality of individual electrodes, the portions between the individual electrodes are filled with the piezoelectric layer 4. Alternatively, only the second electrode layer 6 may be divided into two individual electrodes. Furthermore, for at least one of the first and second electrode layers 5 and 6, the number of divisions is not limited to two, but may be greater than two.

The reinforcing member 2 is formed into a shape such that the flexural rigidity thereof is lower in the substrate's width direction (in the X-axis direction) than in the substrate's thickness direction (in the Z-axis direction). In other words, the reinforcing member 2 is more likely to bend in the width direction of the substrate 1 than in the thickness direction. In the actuator 11 of this embodiment, the lower the widthwise flexural rigidity of the substrate 1 including the reinforcing member 2, the larger the amount of widthwise displacement of the substrate 1. Therefore, if the substrate 1 has a small thickness and is not provided with the reinforcing member 2, the amount of widthwise displacement of the substrate 1 will be increased. However, as will be described later, when the actuator 11 is used in a fine motion mechanism, the substrate 1 is required to have the function of supporting a movable member. Therefore, it is necessary to increase the flexural rigidity of the substrate 1 in the thickness direction, while preventing increase in the flexural rigidity of the substrate 1 in the width direction as much as possible. To that end, the reinforcing member 2 is provided along one of the thicknesswise faces (the substrate face on the opposite side from the piezoelectric element 3) of the substrate 1 in approximately the center in the width direction, with the flexural rigidity of the reinforcing member 2 being lower in the substrate's width direction than in the substrate's thickness direction. An exemplary configuration of the reinforcing member 2 may be a configuration in which the dimension of the reinforcing member 2 in the substrate's thickness direction (in the Z-axis direction) is greater than the dimension thereof in the substrate's width direction (in the X-axis direction) as shown in FIG. 1. By attaching the reinforcing member 2 of this configuration to the substrate 1, decrease in the amount of widthwise displacement of the substrate 1 is minimized, while bending of the substrate 1 in the thickness direction is effectively suppressed, even if the substrate 1 holds the movable member.

The shape of the reinforcing member 2 is preferably as follows. When the average value of the dimension of the reinforcing member 2 in the substrate's width direction (in the X-axis direction) is α times the average value of the width of the substrate 1, and the average value of the dimension of the reinforcing member 2 in the substrate's thickness direction (in the Z-axis direction) is β times the average value of the thickness of the substrate 1, the values of α and β satisfy all of the following expressions:

$0.05 < \alpha < 0.45,$ $1 < \beta < 10,$ and $0.001 < \alpha^3 \beta < 0.1$

Then, the most suitable reinforcing member 2 is obtained, which is capable of reliably suppressing deformation of the substrate 1 in the thickness direction, while not preventing widthwise displacement of the substrate 1 by the piezoelectric element 3.

The reinforcing member 2 is preferably made of glass, silicon, metal, ceramic, or the like, which is favorable material for the substrate 1. In particular, it is highly preferable that the reinforcing member 2 be made of the same material as the substrate 1, because the strength of the bonding with the substrate 1 is increased. And it is even more preferable that the substrate 1 and the reinforcing member 2 are both made of metal material.

In this embodiment, the reinforcing member 2 is provided continuously along the lower face of the substrate 1 in the direction of entire length of the substrate 1. However, the reinforcing member 2 may be provided continuously on part of the lower face of the substrate 1 in the length direction of the substrate 1, or the reinforcing member 2, divided into multiple sections, may be provided in the length direction of the substrate 1.

Also, in this embodiment, the cross section of the reinforcing member 2 is constant in the direction of entire length of the substrate 1, but may be varied according to the positions in the length direction of the substrate 1. For example, when a fine motion mechanism is constructed in the manner described below, the dimension of the reinforcing member 2 in the vertical direction may be increased gradually heading toward a fixed member, while being decreased gradually in the direction toward a movable member. Then, the curvature of bending of the substrate 1 caused by the weight of the movable member is made constant in the direction of entire length of the substrate 1. Consequently, state of strain in the piezoelectric layer 4 is controlled so as to be constant, whereby stable driving becomes possible.

Furthermore, in this embodiment, the reinforcing member 2 is in the shape that is symmetric about the center line of the substrate 1 in the width direction, and is provided on the substrate 1 in approximately the center in the width direction. However, the reinforcing member 2 may be disposed in a position deviating from the center line. Depending upon the composition of the material of the piezoelectric layer 4 and the fabrication method, the piezoelectric characteristics obtained when electric fields are applied thickness-wise to the piezoelectric layer 4 may be varied significantly by the directions of the electric fields (i.e., upward or downward). To be specific, in the piezoelectric layer 4, the portion between the one individual electrode 5a of the first electrode layer 5 and the second electrode layer 6, and the portion between the other individual electrode 5b and the second electrode layer 6 may have different piezoelectric characteristics. In such a case, the reinforcing member 2 may be disposed in a location deviating from the widthwise center of the substrate 1 so as to make adjustment so that the substrate 1 bends in the width direction.

Also, in this embodiment, the two individual electrodes 5a and 5b of the first electrode layer 5 have the same surface area. However, when the piezoelectric characteristics in the piezoelectric layer 4 in the polarization direction and those in the direction opposite to the polarization direction are significantly different from each other as described above, the surface area ratio between the two individual electrodes 5a and 5b may be varied, or the amount of voltage applied to each of the individual electrodes 5a and 5b may be varied, in accordance with the piezoelectric characteristics of the piezoelectric layer 4. In those cases, the effects of the present invention are still obtainable.

Next, a method for fabricating the actuator 11 will be described with reference to FIG. 2.

First, as shown in FIG. 2(a), a substrate 1 having a predetermined width and a predetermined length when viewed from the direction of thickness is prepared, and as shown in FIG. 2(b), a second electrode layer 6 is formed on the substrate 1 by a sputtering method or the like.

Subsequently, as shown in FIG. 2(c), a piezoelectric layer 4 is formed on the second electrode layer 6 by a sputtering method. The method for forming the piezoelectric layer 4 is not limited to sputtering, but a different formation method (e.g., a sol-gel method, a hydrothermal method, or the like) may be used.

Then, as shown in FIG. 2(d), a first electrode layer 5 is formed on the piezoelectric layer 4 by a sputtering method or the like, and then as shown in FIG. 2(e), the first electrode layer 5 is patterned so as to be divided into two individual electrodes 5a and 5b having a certain shape. In this manner, a piezoelectric element 3 is formed on the upper face of the substrate 1.

Next, a member, prepared in advance and serving as a reinforcing member 2, is fixed with an adhesive to the lower face of the substrate 1 in the center widthwise, thereby completing the actuator 11 (i.e., the driver 10) (the adhesive is not shown).

In the fabrication method described above, if the second electrode layer 6 is patterned after the formation of the second electrode layer 6 and before the formation of the piezoelectric layer 4, the second electrode layer 6 is also divided into a plurality of individual electrodes as is the first electrode layer 5. If the piezoelectric layer 4 is formed on the divided second electrode layer 6 by a sputtering process, the portions between the individual electrodes are filled with the piezoelectric layer 4.

Also, in the fabrication method described above, the member serving as the reinforcing member 2 is adhesively fixed to the substrate 1 and thereby mounted onto the substrate 1. Nevertheless, when the substrate 1 and the reinforcing member 2 are both made of metal material, the member serving as the reinforcing member 2 may be mounted by diffusion bonding or by welding. Alternatively, a mold, such as a resist, made of non-conductive material may be formed on the substrate 1, and plating (electroplating or electroless plating) may be performed using the mold, so as to form a reinforcing member 2 made of the plating material on the substrate 1 made of metal material. Even in cases in which the substrate 1 is made of non-conductive material, a nucleation-facilitating-material containing layer, which contains material for facilitating nucleation for the growth of plating for forming a reinforcing member 2, may be formed on the substrate 1, and the reinforcing member 2 made of the plating material may be formed on the nucleation-facilitating-material containing layer. In particular, if Fe, Ni, Pd, or the like, which catalyzes an electroless plating solution, is used as the material for facilitating the nucleation, a reinforcing member made of the electroless plating material such as Ni can be formed on the non-metallic substrate.

Figure 23:
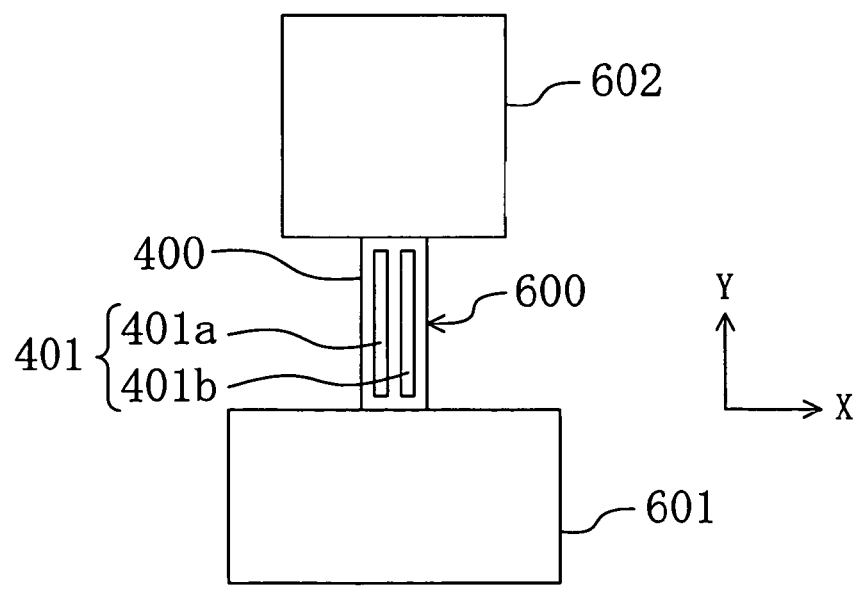
FIG. 23 is a schematic view illustrating a fine motion mechanism including the conventional actuator.
Figure 24:
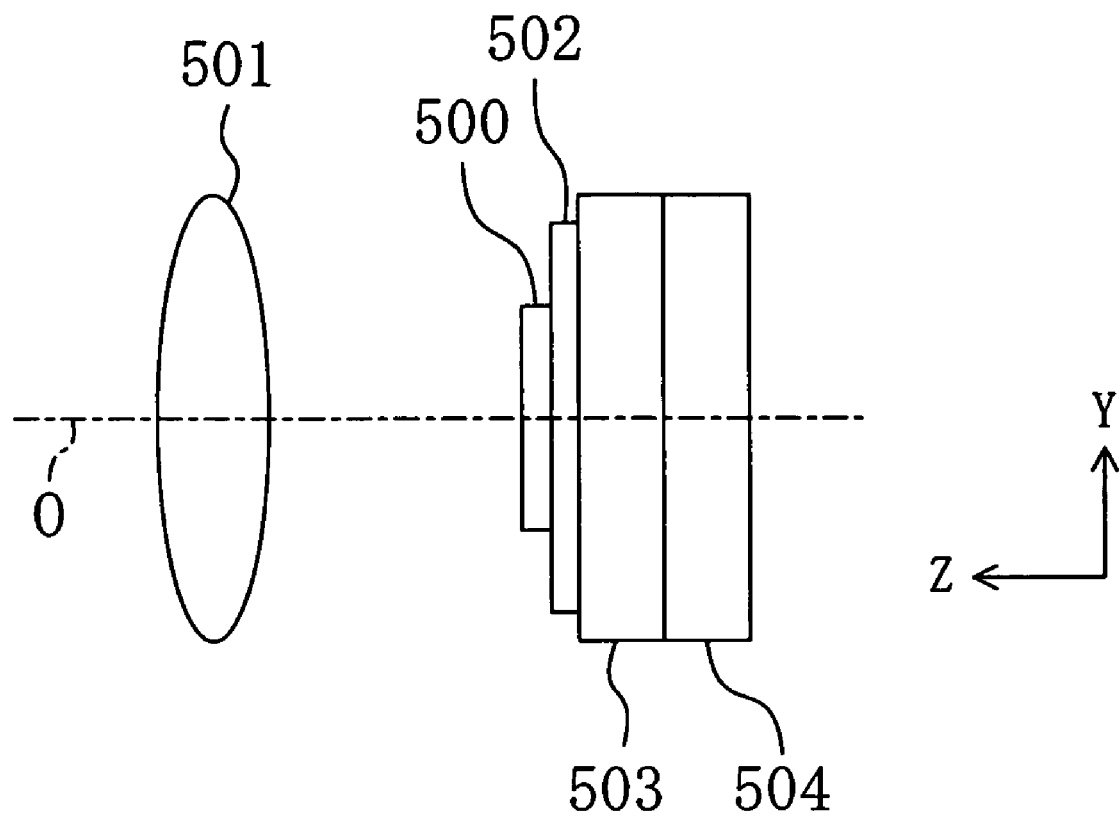
FIG. 24 is a schematic view illustrating a conventional camera module with pixel-shifting capability.

A fine motion mechanism in which the actuator 11 is used to move (produce fine movement of) a movable member can be constructed by replacing the actuator 600 in the conventional fine motion mechanism shown in FIG. 23 with the actuator 11. More specifically, one end portion of the driver 10 (the substrate 1 or the reinforcing member 2) of the actuator 11 in the substrate's length direction is secured to a fixed member, while a movable member is attached and secured to the other end portion of the driver 10 (the substrate 1 or the reinforcing member 2) in the substrate's length direction. Then, by operation of the piezoelectric element 3, the movable member reciprocates with respect to the fixed member in a predetermined plane (a horizontal plane in this embodiment) in the substrate's width direction.

In this fine motion mechanism, the movable member is held by the substrate 1 (and the reinforcing member 2). Since the substrate 1 is not likely to bend in the direction of its thickness because of the presence of the reinforcing member 2, the amount of bending of the substrate 1 in the thickness direction caused by the weight of the movable member is small, even if the substrate 1 holds the movable member. The reinforcing member 2, on the other hand, is likely to bend in the direction of width of the substrate 1, and thus does not prevent widthwise displacement of the substrate 1 by the piezoelectric element 3. In addition, since the piezoelectric element 3 does not need to hold the movable member, the piezoelectric layer 4 in the piezoelectric element 3 can be reduced in thickness, thereby permitting the driving voltage for the piezoelectric element 3 to be lowered. As a result, it is possible to smoothly move the movable member at high speed with low voltage in a predetermined plane, while the amount of movement of the movable member is increased.

The number of actuators 11 for supporting and moving the movable member does not have to be one, but a plurality of actuators 11 may be provided in such a manner that their operations do not interfere with each other, and the movable member may be held and moved by those actuators 11. Alternatively, as will be described later in a fifth embodiment, a plurality of drivers 10 may be provided in a single actuator 11 and then connected in parallel or in series with each other.

Now, specific examples of this embodiment will be described.

EXAMPLE 1

In this example, a crystallized glass plate having a width of 500 μm, a thickness of 100 μm, and a length of 10 μm was used as a substrate in a driver in an actuator, while used as a second electrode layer was a 0.1 μm thick Pt thin film formed by sputtering in an Ar atmosphere at a film growing temperature of 300° C. at a radio frequency power of 100 W at a process pressure of 1 Pa. Used as a piezoelectric layer was a PZT thin film (Zr/Ti=53/47) having a thickness of 2 μm and formed by sputtering in a mixed atmosphere of Ar and $O_2$ at a film growing temperature of 600° C. at a radio frequency power of 600 W at a process pressure of 1 Pa. As a first electrode layer, a Pt thin film formed by sputtering film was patterned by dry etching into two individual electrodes each having a width of 220 μm and a length of 9.5 μm.

Also, a crystallized glass having a height (the dimension in the substrate's thickness direction) of 200 μm, a width (the dimension in the substrate's width direction) of 100 μm, and a length of 5 mm was used as a reinforcing member, and this was adhesively secured onto one of the thickness-wise faces of the substrate in the center in the width and length directions.

One of the lengthwise end portions of the substrate was secured to a fixed member, and a movable member weighing 200 mg was fixed to the other end portion, thereby constructing a fine motion mechanism. The maximum amount of bending of the substrate in the direction of its thickness caused by the weight of the movable member was 41 μm.

Then, with the second electrode layer being grounded, sine wave voltages, 180° out of phase with each other and having a frequency of 500 Hz and an amplitude of 5V, were respectively applied to the two individual electrodes of the first electrode layer, thereby operating the driver of the actuator. At this time, the movable member moved ±1.5 μm in the direction of width of the substrate, allowing the positioning to be performed with an accuracy of 100 nm or less. When the actuator was continuously operated for 1000 hours, the positioning accuracy decreased to 200 nm. Furthermore, drop tests were carried out on the actuator; when the actuator, packaged in a resin case so that the driver was not locked, was dropped from a height of 50 cm, the actuator was not broken. However, when the actuator was dropped from a height of 1 m, cracks appeared in the end portion of the driver (the substrate or the reinforcing member) closer to the fixed member.

EXAMPLE 2

In this example, the thickness of a substrate and the length of a reinforcing member in a driver in an actuator were different from those of the Example 1. Specifically, the length of the reinforcing member was made equal to the length of the substrate so that the reinforcing member continuously extended the entire length of the substrate, while the thickness of the substrate was half that of Example 1. More specifically, the substrate was made of a crystallized glass plate having a width of 500 µm, a thickness of 50 µm, and a length of 10 mm, while the reinforcing member had a height of 200 µm, a width of 100 µm, and a length of 10 mm. The other materials and the method for fabricating the actuator were the same as those of Example 1.

Then, a fine motion mechanism similar to that of Example 1 was constructed using the above-described actuator. In the fine motion mechanism, the maximum bending of the substrate in the thickness direction caused by the weight of the movable member was 25 µm. When the same sine wave voltages as those of Example 1 (however, the frequency was 400 Hz) were applied to the first and second electrode layers to operate the actuator, the movable member reciprocated ±2.5 µm in the direction of width of the substrate, allowing the positioning to be performed with an accuracy of 100 nm or less. The reason why the sine wave voltages had a frequency of 400 Hz was because frequencies higher than this caused unstable operation. When the actuator was continuously operated for 1000 hours, the positioning accuracy decreased to 200 nm. Furthermore, as in Example 1, drop tests were carried out on the packaged actuator; when the actuator was dropped from a height of 50 cm, the actuator was not broken. However, when the actuator was dropped from a height of 1 m, cracks appeared in the end portion of the driver (the substrate or the reinforcing member) closer to the fixed member.

EXAMPLE 3

In this example, the ratio in size between the substrate and the reinforcing member was changed to clarify the range in which the effects of the present invention were obtainable.

Specifically, the size of the crystallized glass used as the reinforcing member in Example 2 was changed, and the maximum amount of bending of the substrate in the direction of thickness and the maximum amount of movement of the movable member were examined. The substrate used in this examination had a width of 500 µm, a thickness of 50 µm, and a length of 10 mm, and the size of the reinforcing member was changed with respect to the size of the substrate. Specifically, different kinds of actuators were prepared by changing the values of α and β described in the first embodiment.

Figure 3:
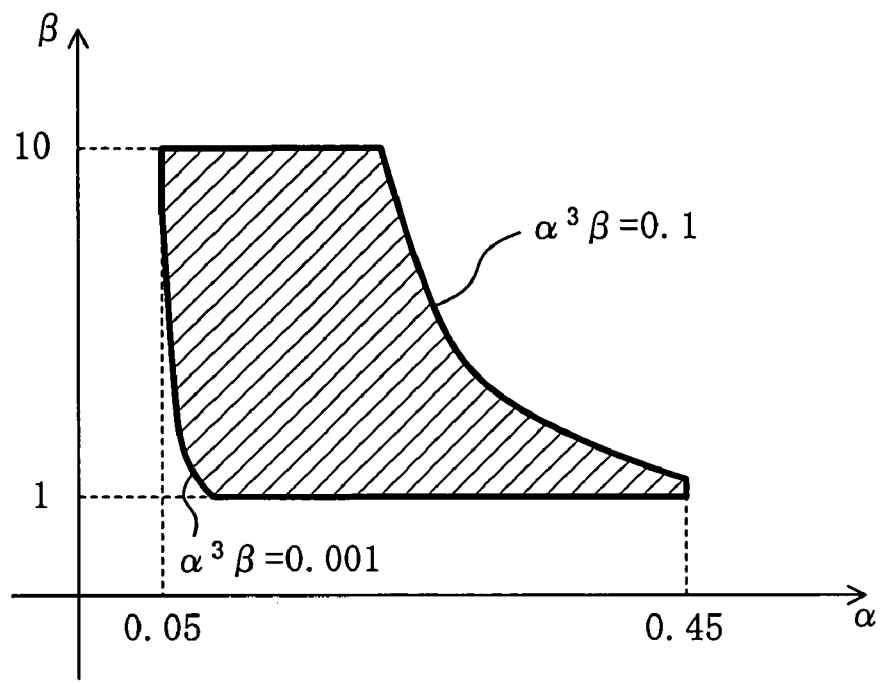
FIG. 3 is a graph illustrating the range of values of α and β, in which the effects of the present invention are obtainable.

FIG. 3 illustrates a range in which the effects of the present invention are obtainable. The shadowed portion in the figure is a range in which the effects of the present invention are obtainable. Herein, in the range in which the effects of the present invention are obtainable, when the weight of the movable member is from 10 mg to 500 mg, the maximum amount of thickness-wise bending of the substrate caused by the weight of the movable member is not more than 50 µm and the maximum amount of movement of the movable member is equal to or more than 1 µm. The effects of the present invention cannot be sufficiently achieved outside this range. To be specific, if the value of α is too small (equal to or less than 0.05), or if the value of β is too large (equal to or greater than 10), the stiffness of the reinforcing member deteriorates to become insufficient to support the movable member. On the other hand, if the value of α is too large (equal to or more than 0.45), or if the value of β is too small (equal to or less than 1), the amount of movement of the movable member becomes too small, although there is no problem with the stiffness for supporting the movable member, and thus the fine motion mechanism does not function suitably.

EXAMPLE 4

In this example, the width of the substrate (the crystallized glass) of Example 2 was changed to examine the relationship between the width of the substrate and the amount of movement of the movable member.

The results showed that as the width of the substrate was increased, the amount of movement of the movable member decreased, and that when the width of the substrate was greater than 20 times the thickness thereof, the substrate was twisted. Due to this twist, the movable member did not move in a plane, and thus the fine motion mechanism no longer functioned as a fine motion mechanism for moving the movable member in a plane. On the other hand, when the width of the substrate was smaller than or equal to the thickness thereof, the flexural rigidity of the substrate in the thickness direction became higher than the flexural rigidity thereof in the width direction, in which case, the presence of the reinforcing member became meaningless. Furthermore, when the length of the substrate was less than four times the width thereof, the amount of movement of the movable member became too small and the fine motion mechanism did not function suitably.

Second Embodiment

In this embodiment, the materials of the substrate 1 and the reinforcing member 2 are changed to metal. The operation accuracy and the shock resistance characteristics of the actuator 11 greatly depend upon the materials of the substrate 1 and reinforcing member 2 and the mounting method thereof. The shock resistance characteristics of the actuator 11 (the driver 10) can be improved by using metal having high ductility. Where the substrate 1 and the reinforcing member 2 are made of metal material, the reinforcing member 2 may be mounted onto the substrate 1 by welding, by the above-mentioned plating, or the like. When the reinforcing member 2 is formed by plating, the reinforcing member 2 can be mounted onto the substrate 1 with great accuracy, while the reliability in long-term operation can be increased.

Now, specific examples of this embodiment will be described.

EXAMPLE 5

Figure 4:
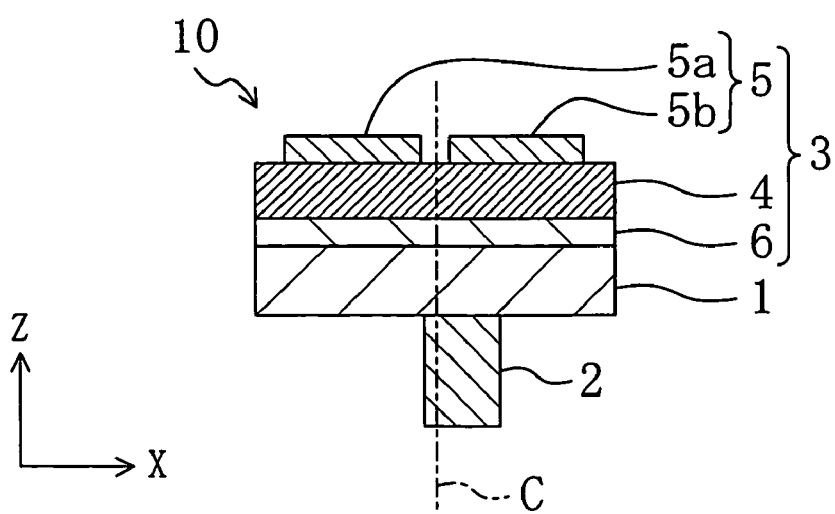
FIG. 4 is a cross-sectional view of a driver of an actuator according to Example 5.

FIG. 4 illustrates a driver 10 of an actuator according to Example 5. In this example, the materials of the substrate 1 and reinforcing member 2, the mounting position of the reinforcing member 2, and the method for mounting the reinforcing member 2 were different from those of Example 2.

Specifically, the substrate 1 was made of a stainless steel (SUS304) plate having width of 500 µm, a thickness of 50 µm, and a length of 10 mm, while the reinforcing member 2 was made of stainless steel (SUS304) having a height of 200 µm, a width of 100 µm, and a length of 10 mm. As in Example 1, a Pt film was formed as a second electrode layer 6. On this Pt film, a PZT thin film was formed as a piezoelectric layer 4. On the PZT thin film, a Pt film was formed as a first electrode layer 5. The Pt film as the first electrode layer 5 was dry-etched and thereby divided into two individual electrodes 5a and 5b each having a width of 220 µm and a length of 9.5 mm. In this manner, the piezoelectric element 3 was formed on the upper face of the substrate 1. However, in this example, the piezoelectric characteristics of the PZT thin film in the upward thickness direction of the PZT thin film differed from those in the downward thickness direction due to the effects of the surface condition of the substrate 1; the piezoelectric characteristics in the upward thickness direction exceeded those in the downward thickness direction by 30%. In order to adjust this difference in the piezoelectric characteristics, the substrate 1 and the reinforcing member 2 were brought into alignment so that the mounting location of the reinforcing member 2 on the lower face of the substrate 1 is displaced by 40 µm in the X-axis direction from the widthwise center line C of the substrate 1, and the reinforcing member 2 was fixed by laser welding of the connection portion between the substrate 1 and the reinforcing member 2.

One of the lengthwise end portions of the substrate 1 was secured to a fixed member, while a movable member weighing 200 mg was fixed to the other end portion, thereby constructing a fine motion mechanism. The maximum bending of the substrate 1 in the thickness direction caused by the weight of the movable member was 20 µm.

With the second electrode layer 6 being grounded, a driving voltage, having an amplitude of 2.5V and offset by 2.5V in the positive direction (i.e., ranging from 0V to 5V) and having a frequency of 400 Hz, was applied to the one individual electrode 5a of the first electrode layer 5, while a driving voltage, being 180° out of phase with the one individual electrode 5a, having an amplitude of 2.5V and offset by 2.5V in the negative direction (i.e., ranging from 0V to −5V) and having a frequency of 400 Hz, was applied to the other individual electrode 5b, whereby the driver of the actuator was operated.

At this time, the movable member moved 2.0 µm in the direction of width of the substrate 1, allowing the positioning to be performed with an accuracy of 100 nm or less. When the actuator was continuously operated for 1000 hours, the positioning accuracy decreased to 200 nm. Furthermore, a drop test was carried out; the actuator packaged as in Example 1 was dropped from a height of 1 m, but no breakages were observed in the actuator. From this, it was found that by changing the material of the substrate 1 and reinforcing member 2 to metal material, the shock resistance characteristics were improved.

If the conditions for growing the piezoelectric layer 4 are optimized in accordance with the surface state of the substrate 1, it is possible to make the piezoelectric characteristics be substantially the same in the upward direction and in the downward direction, and thus it also becomes possible to dispose the reinforcing member 2 on the lower face of the substrate 1 in the center in the width direction, as in Examples 1 and 2.

EXAMPLE 6

FIG. 5 indicates a method for forming a reinforcing member 2 in a driver 10 in an actuator according to Example 6. This example differs from Example 5 in that the reinforcing member 2 was formed by electroplating. More specifically, 5 µm thick polyimide 16 was first applied to surround a substrate 1 having a piezoelectric element 3 thereon, and part of the polyimide 16, located on the lower face of the substrate 1 and corresponding to a portion on which the reinforcing member 2 was to be mounted, was removed by patterning (see FIG. 5(a)).

The applied polyimide 16 is cured, and then a dry film resist 18 serving as a mold for forming the reinforcing member 2 was put on part of the polyimide 16 and the portion of the dry film resist 18 in which the reinforcing member 2 was to be formed was removed by patterning, thereby forming a mold having an opening 200 µm deep and 50 µm wide (see FIG. 5(b)).

Next, the entire body was immersed in an electroplating solution of Ni at 50° C., and voltage was applied for 30 minutes across the substrate 1 and the plating electrode, thereby forming, in the opening in the mold, the reinforcing member 2 made of the electroplating material of Ni and having a height of 200 µm, a width of 100 µm, and a length of 10 mm (see FIG. 5(c)).

After the plating process was complete, the dry film resist 18 was removed using a peeling solution. In this way, the reinforcing member 2, made of the plating material and directly joined to the substrate 1 made of metal material, was formed (see FIG. 5(d)).

The material of the substrate 1, the materials of the layers in the piezoelectric element 3, and the actuator fabrication method were the same as those of Example 5, except for the method for forming the reinforcing member 2.

One of the lengthwise end portions of the substrate 1 was secured to a fixed member, while a movable member weighing 200 mg was fixed to the other end portion, thereby constructing a fine motion mechanism. The maximum amount of bending of the substrate 1 in the thickness direction caused by the weight of the movable member was 20 µm.

With the second electrode layer 6 being grounded, a driving voltage, having an amplitude of 2.5V and offset by 2.5 V in the positive direction (i.e., ranging from 0V to 5V) and having a frequency of 400 Hz, was applied to the one individual electrode 5a of the first electrode layer 5, while a driving voltage, being 180° out of phase with the one individual electrode 5a, having an amplitude of 2.5V and offset by 2.5V in the negative direction (i.e., ranging from −5V to 0V) and having a frequency of 400 Hz, was applied to the other individual electrode 5b, whereby the actuator was operated.

At this time, the movable member moved 2.0 µm in the direction of width of the substrate 1, allowing the positioning to be performed with an accuracy of 80 nm or less. After the actuator was continuously operated for 1000 hours, the positioning accuracy was 80 nm and the positioning characteristics did not deteriorate. Furthermore, as in Example 1, a drop test was carried out, in which the packaged actuator was dropped from a height of 1 m. After the test, no breakages were observed in the actuator. From this, it was found that by forming the reinforcing member 2 made of plating material directly on the substrate 1 made of metal material, the shock resistance characteristics were improved without degradation of the positioning accuracy that would otherwise be caused by the long-term operation, whereby the reliability was increased.

Moreover, since the applied polyimide 16, which covers the periphery of the driver 10 of the actuator, also functions as a protective layer for the driver 10, faults in the actuator were reduced in the later process steps such as an assembly process.

EXAMPLE 7

This example differs from Example 2 in that silicon substrates were used as substrates in drivers in actuators, and reinforcing members were formed by electroless plating, and in that 700 actuators were fabricated at the same time.

More specifically, an alloy film of Ir and Ti was formed as a second electrode layer on a 525 µm thick, 4 inch silicon substrate, On this alloy film, a PZT thin film was formed as a piezoelectric layer. On the PZT thin film, a Pt film was formed as a first electrode layer. The Pt film was then divided so as to obtain 700 pairs of individual electrodes, with each individual electrode having a width of 220 μm and a length of 9.5 mm.

Subsequently, the substrate was polished from its face that opposes the face thereof having the above films formed thereon, until the substrate had a thickness of 50 μm. Thereafter, a nucleation-facilitating-material containing layer was formed on the polished face by sputtering, the nucleation-facilitating-material containing layer containing material for facilitating nucleation for the growth of plating when reinforcing members were formed by electroless plating. In this example, with Pd used as the nucleation-facilitating material, a Pd film was formed to a thickness of 0.1 μm.

Next, a dry film resist was put on the nucleation-facilitating-material containing layer and then patterned, thereby forming a mold having openings each having a depth of 200 μm and a width of 50 μm.

Then, the entire body was immersed in an electroless plating solution and treated for three hours at 90° C., thereby forming, in the openings in the mold, reinforcing members made of the electroless plating material of Ni and each having a height of 200 μm, a width of 100 μm, and a length of 10 mm. The dry film resist was then peeled off, and then the entire body was divided into 700 actuators by laser dicing.

Using one of the actuators thus fabricated, a fine motion mechanism was constructed; one of the lengthwise end portions of the substrate was secured to a fixed member, while a movable member weighing 200 mg was fixed to the other end portion. The maximum amount of bending of the substrate in the thickness direction caused by the weight of the movable member was 22 μm.

When the same voltages as those of Example 2 were applied to the first and second electrode layers to operate the actuator, the movable member reciprocated ±2.2 μm in the direction of width of the substrate, allowing the positioning to be performed with a precision of 80 nm or less. After the actuator was continuously operated for 1000 hours, the positioning accuracy was 80 nm and the positioning characteristics thus did not deteriorate. Furthermore, as in Example 1, a drop test was carried out, in which the packaged actuator was dropped from a height of 80 cm. After the test, no breakages were observed in the actuator. However, when the actuator was dropped from a height of 1 m, cracks appeared in the end portion of the driver (the substrate or the reinforcing member) closer to the fixed member.

In this example, after the nucleation-facilitating-material containing layer (the Pd film) was formed, the mold was formed out of the dry film resist. However, it is sufficient if the nucleation-facilitating-material containing layer is present at least between the substrate and the reinforcing members. Therefore, the unnecessary portion of the nucleation-facilitating-material containing layer may be removed by etching before the formation of the dry film resist. Also, the layer between the substrate and the reinforcing members does not have to be the Pd film alone, but an adhesive layer made of Ti, Cr, or the like may also be formed between the substrate and the Pd film. Moreover, the nucleation-facilitating-material containing layer does not need to be made of Pd alone, but may be formed of an alloy of Pd and other metal.

COMPARATIVE EXAMPLE

Figure 22:
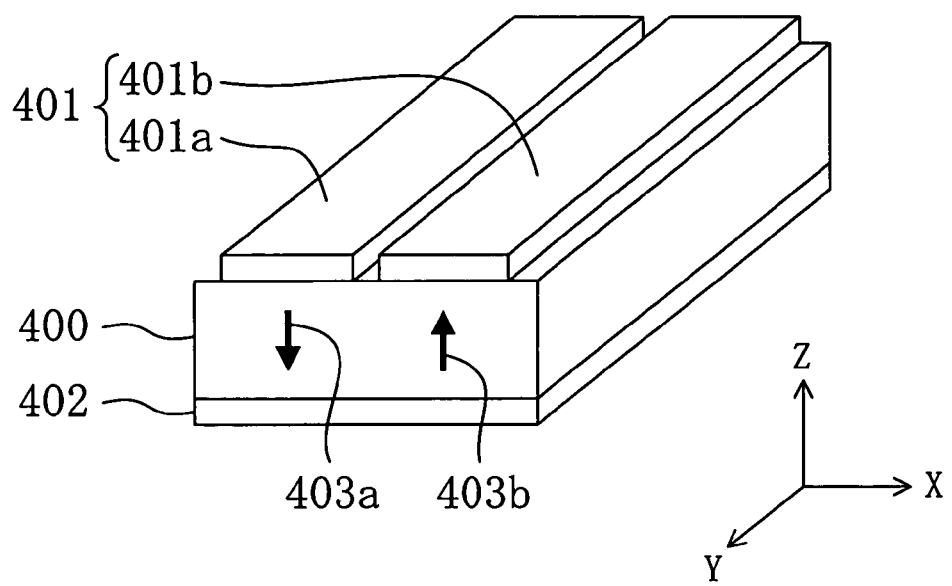
FIG. 22 is an oblique view illustrating a conventional actuator.

As a comparative example, an actuator similar to the conventional actuator shown in FIG. 22 was fabricated, and a movable member having the same weight (200 mg) as the movable member of Example 1 was moved by this actuator. In the actuator of the comparative example, the movable member was supported by a piezoelectric layer. The piezoelectric material of this piezoelectric layer was sintered PZT, and the first and second electrode layers were Pt thin films formed by sputtering.

In order that when the same voltages as those of Example 1 were applied to the first and second electrode layers for operation of the actuator, the movable member would reciprocate ±2.5 μm in the direction of width of the piezoelectric layer (the sintered body) and the maximum amount of thickness-wise bending of the piezoelectric layer caused by the movable member would be 25 μm as in Example 2, the sintered PZT was required to have a width of 800 μm, a thickness of 400 μm, and a length of 25 mm. That is, the thickness and the length had to be eight times and 2.5 times those of Example 2, respectively.

If the width of the sintered PZT is increased, it is possible to reduce the thickness of the sintered body. However, in that case, the flexural rigidity of the sintered body in the width direction is increased to thereby decrease the amount of movement of the movable member. In order to prevent this, it was required that the driving voltage be increased or the length of the sintered body be increased further.

Third Embodiment

Figure 6:
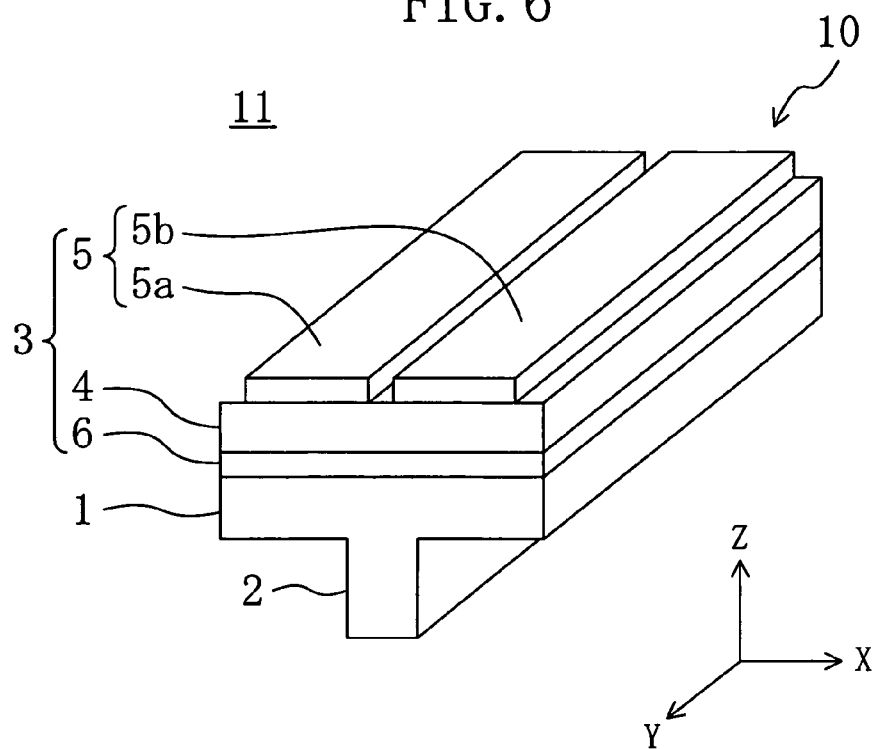
FIG. 6 is an oblique view illustrating an actuator according to a third embodiment of the present invention.

FIG. 6 illustrates an actuator 11 according to a third embodiment of the present invention, in which a reinforcing member 2 is formed integral with a substrate 1. The substrate 1 and reinforcing member 2 of this configuration can be easily obtained, e.g., by performing processing, such as dry etching, on the silicon substrate 1. In the other respects, the actuator 11 of this embodiment is the same as that of the first embodiment (shown in FIG. 1), and detailed descriptions thereof will be thus omitted herein.

In this embodiment, the positioning accuracy of the reinforcing member 2 with respect to the substrate 1 is increased, while the reinforcing member 2 is never separated from the substrate 1. Therefore, when a movable member is driven by a fine motion mechanism in which the actuator 11 of this embodiment is used, the positioning accuracy and the reliability are increased.

Now, specific examples of this embodiment will be described.

EXAMPLE 8

In this example, a substrate and a reinforcing member were formed in one body by dry-etching of a 250 μm thick silicon substrate. The entire dimensions of the substrate and reinforcing member were the same as those of Example 2. The other materials were the same as those of Example 1.

A fine motion mechanism was constructed using the actuator described above, and the maximum amount of bending of the substrate in the thickness direction caused by the weight of the movable member was 23 μm. Also, when the actuator was operated in the same manner as in Example 1, the movable member reciprocated ±2.3 μm in the direction of width of the substrate, allowing the positioning to be performed with an accuracy of 50 nm or less. Furthermore, after the actuator was continuously operated for 1000 hours, the positioning accuracy did not deteriorate.

Therefore, it was found that the positioning accuracy of the movable member and the reliability were increased by integrally forming the reinforcing member 2 with the substrate 1.

Fourth Embodiment

Figure 7:
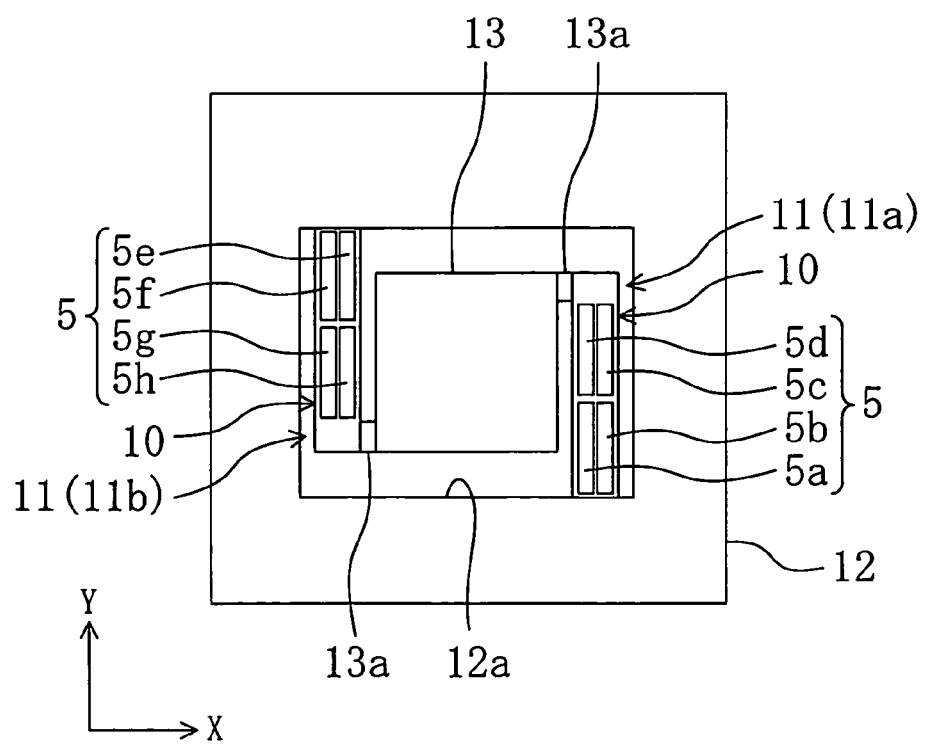
FIG. 7 is a plan view illustrating a fine motion mechanism according to a fourth embodiment of the present invention.

FIG. 7 illustrates a fine motion mechanism according to a fourth embodiment of the present invention. This fine motion mechanism is best suited to perform pixel-shifting in a camera module including an imaging device and an optical lens for guiding light to the imaging device (pixel-shifting is a technique for obtaining a high-resolution image by effecting relative movement of the imaging device with respect to the optical lens in a direction perpendicular to the optical axis of the optical lens).

More specifically, this fine motion mechanism includes two actuators 11 (in FIG. 7, one of the actuators 11 is designated by the reference numeral 11a, while the other actuator is represented by the reference numeral 11b), and is designed so that the drivers 10 of these actuators 11 support and drive a movable member 13. Each actuator 11 is similar in configuration to the actuators 11 of the first to third embodiments, but has a different first electrode layer 5, as will be described later.

To be more specific, one end portion of the driver 10 of each actuator 11 in the direction of length of the substrate 1 is secured to a fixed member 12. The fixed member 12 is a plate extending horizontally, and in the center of the fixed member 12, a rectangular through-hole 12a passing through the fixed member 12 in the direction of thickness of the fixed member 12 (i.e., in the vertical direction) is formed. The actuators 11 are fixed to respective positions located in the vicinity of the two vertices of opposite angles of the rectangle formed by the inner faces of the through-hole 12a, and in the through-hole 12a, the drivers 10 of the actuators 11, which are spaced a predetermined distance away from each other in the X-axis direction shown in FIG. 7, extend in parallel with each other in the Y-axis direction perpendicular to the X-axis direction.

Between the actuators 11, a rectangular movable member 13 is disposed. The movable member 13 is attached and secured to the other end portion (the tip) of the driver 10 of each actuator 11 in the direction of length of the substrate 1. The attachment portions 13a of the movable member 13 to the actuators 11 protrude from the side faces of the movable member 13 in the X-axis direction.

The first electrode layer 5 in the driver 10 of each actuator 11 differs from those of the first to third embodiment and is divided into four individual electrodes (in FIG. 7, the four individual electrodes of the one actuator 11a are identified by the reference characters 5a to 5d, while the four individual electrodes of the other actuator 11b are represented by the reference characters 5e to 5h). These individual electrodes 5a through 5h have the same surface area. In the one actuator 11a, the individual electrodes 5a through 5d are arranged two by two in the substrate's width direction and in the substrate's length direction so as to be located at the respective vertices of a rectangle when viewed from the direction of thickness of the substrate 1. When the driver 10 of the actuator 11a is operated, equal voltages are applied to the two individual electrodes 5a and 5c located respectively at the two vertices of the opposite angles of the rectangle, and equal voltages are also applied to the two individual electrodes 5b and 5d located respectively at the other two vertices. The voltages applied to the individual electrodes 5a and 5c and the voltages applied to the individual electrodes 5b and 5d are the same in magnitude but opposite in polarity. Then, in the piezoelectric layer 4, the electric fields applied to the portions corresponding to the two individual electrodes 5a and 5c have the same magnitude, and the electric fields applied to the portions corresponding to the other two individual electrodes 5b and 5d also have the same magnitude. Also, in the piezoelectric layer 4, the electric fields applied to the portions corresponding to the individual electrodes 5a and 5c and the electric fields applied to the portions corresponding to the individual electrodes 5b and 5d are the same in magnitude but opposite in direction. Second electrode layers 6 are grounded.

As described in the first embodiment, in cases in which the piezoelectric characteristics obtained when electric fields are applied in the direction of thickness of the piezoelectric layer 4 vary significantly depending upon the directions of the electric fields, the amount of voltage applied to the individual electrodes 5a and 5c and the amount of voltage applied to the individual electrodes 5b and 5d may be made different from each other. Specifically, the magnitude of electric fields applied to the portions in the piezoelectric layer 4 corresponding to the individual electrodes 5a and 5c and the magnitude of electric fields applied to the portions in the piezoelectric layer 4 corresponding to the individual electrodes 5b and 5d may be made different from each other according to the piezoelectric characteristics of the piezoelectric layer 4.

In the other actuator 11b as in the actuator 11a, the individual electrodes 5e through 5h are arranged two by two in the substrate's width direction and in the substrate's length direction so as to be located at the respective vertices of a rectangle when viewed from the direction of thickness of the substrate 1. When the driver 10 of the actuator 11b is operated, equal voltages are applied to the two individual electrodes 5f and 5h located respectively at the two vertices of the opposite angles of the rectangle, and equal voltages are also applied to the two individual electrodes 5e and 5g located respectively at the other two vertices. Also, the voltages to the individual electrodes 5f and 5h and the voltages to the individual electrodes 5e and 5g are opposite in polarity but the same in magnitude.

Reasons for the above configuration are as follows.

As shown in FIG. 8(a), in a configuration in which a first electrode layer 5 is divided into two individual electrodes 5a and 5b as in the first to third embodiments, one of the lengthwise ends of the substrate 1 is displaced with respect to the other end while describing an arc as its trajectory in the direction of width of the substrate 1 (in the X-axis direction shown in FIG. 8(a)). This causes the movable member 13 attached to the other end portion of the substrate 1 (the tip of the driver 10) also to move along an arc (i.e., to rotate about an axis extending in the vertical direction). The movable member 13 therefore moves not only in the width direction of the substrate 1 but also in the length direction (in the Y-axis direction). Nevertheless, this movement is very small and thus causes no problems under normal conditions. However, in cases in which a plurality of actuators 11 support a movable member 13 as in this embodiment, the rotations of the respective actuators 11 about the vertically extending axes interfere with each other to cause a problem in that the amount of movement of the movable member 13 is decreased. In order to overcome this problem, the trajectory of the movable member needs to be a line, not an arc.

In view of this, in this embodiment, the actuator 11a is configured as described above. That is, the first electrode layer 5 is divided into the four individual electrodes 5a through 5d, and with the second electrode layer 6 grounded, voltages having the opposite polarities are applied to the individual electrodes 5a and 5c and the individual electrodes 5b and 5d. For example, as shown in FIG. 8(b), when a negative voltage is applied to the individual electrodes 5a and 5c while a positive voltage is applied to the individual electrodes 5b and 5d, the substrate 1 bends widthwise so that two inflection points are generated in the lengthwise center of the substrate 1, when viewed from the direction of thickness of the substrate 1, whereby the tip of the driver 10 of the actuator 11a moves along a line in the direction of width of the substrate 1. The driver 10 of the actuator 11b is also driven in the same manner as the driver 10 of the actuator 11a. In order to make the driver 10 of the actuator 11b operate in cooperation with the driver 10 of the actuator 11a (i.e., in order to move the movable member 13 in the same direction), voltages are applied in the following manner. When a negative voltage is applied to the individual electrodes 5a and 5c of the actuator 11a and a positive voltage is applied to the individual electrodes 5b and 5d, a positive voltage is applied to the individual also electrodes 5e and 5g of the actuator 11b and a negative voltage is applied to the individual electrodes 5f and 5h. On the other hand, when a positive voltage is applied to the individual electrodes 5a and 5c and a negative voltage is applied to the individual electrodes 5b and 5d, a negative voltage is applied to the individual electrodes 5e and 5g and a positive voltage is applied to the individual electrodes 5f and 5h. If voltages are applied in this manner, the movable member 13 moves smoothly, such that decrease in the amount of movement is suppressed.

The number of divisions of the first electrode layer 5 is not limited to four. Even in cases where the number of divisions is greater than four (preferably an even number), it is possible to move the tip of the driver 10 of each actuator 11 along a line in the direction of width of the substrate 1.

If an imaging device is provided on the movable member 13 of the above fine motion mechanism and the imaging device is moved with respect to the fixed member 12 (i.e., an optical lens) in a direction (the X-axis direction in FIG. 7) perpendicular to the optical axis of the optical lens, a high-resolution image can be obtained. FIG. 9(a) is an enlarged view of the imaging device. In this imaging device 15, a large number of photoreceptors 15a are arranged in lines. Since electrical circuitry (not shown) and the like are disposed around the photoreceptors 15a, the photoreceptors 15a are not disposed over the entire area of the imaging device 15. Therefore, if the imaging device 15 is moved by the fine motion mechanism so that the photoreceptors 15a move into portions in which no photoreceptors 15a are provided, a high-resolution image can be obtained. This technique, which is called pixel-shifting, provides a high-resolution image similar to one obtained by a high-resolution imaging device. It is thus possible to consider that a pseudo-high-resolution imaging device is included in the fine motion mechanism.

By the use of the above-described fine motion mechanism, the actuators 11 can be reduced in thickness and size, thus leading to reduction of the thickness and size of the camera module with pixel-shifting capability.

FIG. 9(b) schematically illustrates how the positions of the photoreceptors 15a vary when a high-resolution image having twice as many pixels is obtained by using the above-described fine motion mechanism in which the movable member 13 (the imaging device 15) is moved slightly in a single axis direction. At first, the photoreceptors 15a are situated in the locations indicated by "1" in FIG. 9(b), and the photoreceptors 15a in the locations "1" capture an image. Thereafter, the imaging device 15 is moved slightly in the direction indicated by the arrow A in FIG. 9(b) so that the photoreceptors 15a are situated in the locations indicated by "2" in FIG. 9(b), and the photoreceptors 15a in the locations "2" capture an image. These two images are then synthesized to obtain a high-resolution image having twice as many pixels.

Now, specific examples of this embodiment will be described.

EXAMPLE 9

In this example, the electrode configuration in the driver of the actuator of Example 8 was changed such that the number of electrode divisions was four as described in the fourth embodiment, and by using two actuators of this configuration, a fine motion mechanism shown in FIG. 7 was constructed. More specifically, in each actuator, a reinforcing member was formed integral with a silicon substrate by etching of the silicon substrate. Together with the reinforcing member, a fixed member and a movable member were also formed integral with the substrate. These substrate, reinforcing member, fixed member, and movable member were integrally formed by dry-etching of the silicon substrate, in which fluorinated gas was mainly used. The substrate in the driver of each actuator had a width of 700 µm, a thickness of 50 µm, and a length of 12 mm, while the reinforcing member had a height of 250 µm, a width of 70 µm, and a length of 12 mm. The first and second electrode layers and the piezoelectric layers in the piezoelectric elements were each formed by sputtering as in Example 1. Each piezoelectric layer was formed out of a 3 µm thick PZT thin film (Zr/Ti=53/47). As in the actuators of the fourth embodiment, the first electrode layers were each divided into four individual electrodes. Each divided electrode had a width of 320 µm and a length of 5.5 mm.

The fine motion mechanism was constructed in such a manner that the movable member attached to the drivers of the two actuators weighed 200 mg. In this fine motion mechanism, the maximum amount of bending of the substrates in the direction of thickness caused by the weight of the movable member was 15 µm. In each actuator, a voltage of 5V was applied to two individual electrodes located respectively at the two vertices of opposite angles of the rectangle, while a voltage of −5V was applied to the other two individual electrodes, whereby the movable member moved 1.4 µm along a line in the substrate's width direction. The configuration in which the movable member was supported by the two actuators allowed the bending of the substrates in the thickness direction (in the vertical direction) to be suppressed more effectively.

EXAMPLE 10

Figure 10:
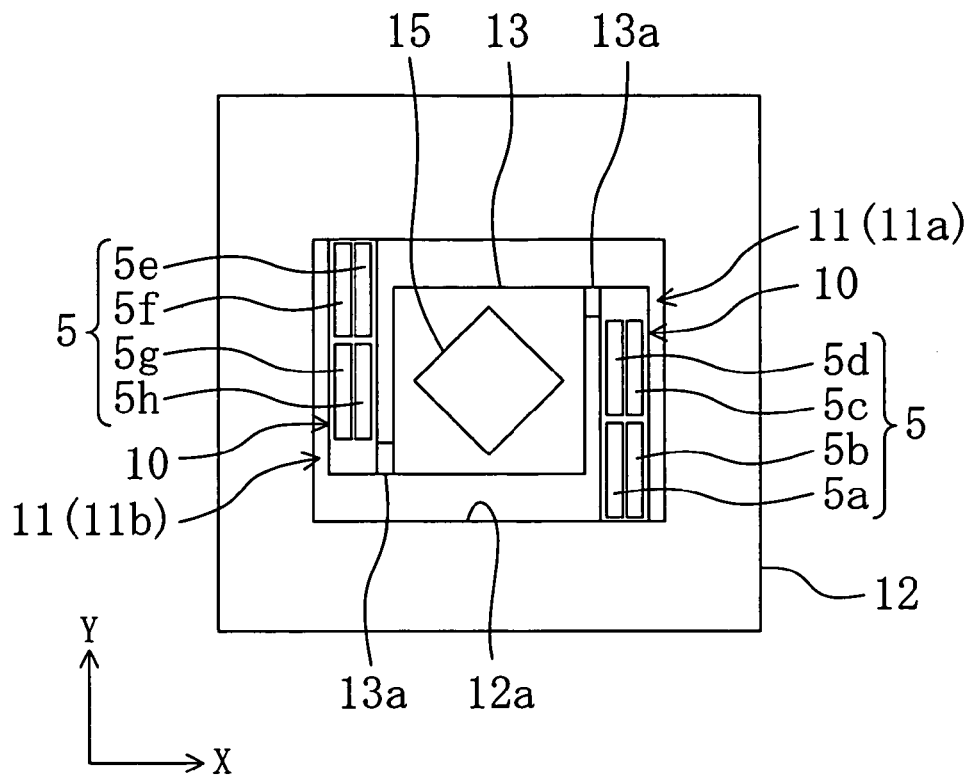
FIG. 10 illustrates an imaging-device fine-motion mechanism for a camera module according to Example 10.

FIG. 10 illustrates an imaging-device fine-motion mechanism for a camera module according to Example 10. This fine motion mechanism was constructed by disposing an imaging device 15 on the movable member 13 of the fine motion mechanism of Example 9. This imaging device 15 is moved with respect to the fixed member 12 (the optical lens) in one axial direction (the X-axis direction in FIG. 10) perpendicular to the optical axis of the optical lens, whereby a high-resolution image having twice as many pixels can be obtained.

The imaging device 15 was the same as that shown in FIG. 9(a), and the pixel pitch (the distance between two adjacent photoreceptors 15a) was 2 µm. This imaging device 15 was mounted on the movable member 13 in such a manner that the pixel's opposite-angle direction (the direction A in FIG. 9(b)) agreed with the movement direction of the fine motion mechanism (the X-axis direction in FIG. 10). The optical lens for guiding light to the imaging device 15 was disposed in front of the paper of FIG. 10 so as to face the imaging device 15 and is indirectly secured to the fixed member 12. This optical lens was disposed in such a manner that the optical axis thereof extended in a direction perpendicular to the paper of FIG. 10.

Figure 11:
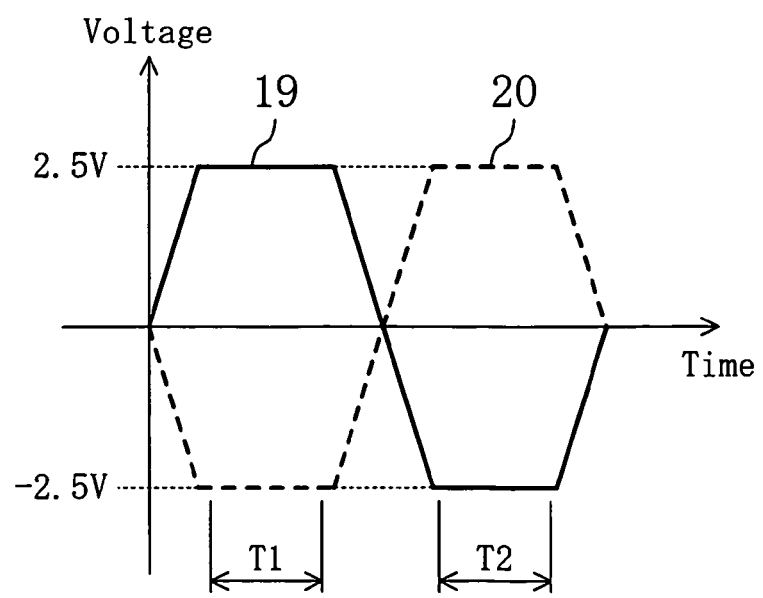
FIG. 11 illustrates the waveforms of voltages applied to individual electrodes of drivers of actuators in the imaging-device fine-motion mechanism according to Example 10.

If the fine motion mechanism operates while an image is being taken, the image is blurred and deteriorates in quality. Therefore, application of voltages to the individual electrodes was performed using trapezoidal waves shown in FIG. 11. In FIG. 11, the abscissa represents the time, while the ordinate indicates the voltage. Since it was sufficient if the imaging device moved 1.4 μm in the pixel's opposite-angle direction, a voltage having a waveform 19 and varying between −2.5V and 2.5V was applied to the individual electrodes 5a and 5c (5f and 5h), while a voltage having a waveform 20, which was 180° out of phase with the waveform 19, was applied to the individual electrodes 5g and 5d (5e and 5g). This enabled the uniform shifting of pixels over the entire area of the imaging device, whereby a high-quality, high-resolution image was obtained.

If the actuators move when an image is being taken, the quality of the image deteriorates. Therefore, the first image was taken during an image taking time T1 shown in FIG. 11 (which is a period of time in which the voltage was constant and the movable member was standing still), and the second image was taken during an image taking time T2 (like the image taking time T1, which is a period of time in which the voltage was constant and the movable member was standing still). The time interval between the beginnings of consecutive image taking times depends upon the operation speed of the fine motion mechanism, and in this embodiment, 2.5 ms (400 Hz) was the limit.

FIFTH EMODIMENT

In this embodiment, a plurality of drivers 10 are provided to obtain a higher-performance actuator 11. To be specific, as shown in FIG. 12(a), for example, a plurality of (two in FIG. 12(a)) drivers 10 are provided in which the respective faces of substrates 1, having reinforcing members 2 formed thereon, face in the same direction and are arranged in parallel with each other in the substrate's width direction. And these drivers 10 are connected in parallel with each other by connecting members 23a and 23b at the both end portions of the drivers 10 (the substrates 1 or the reinforcing members 2) in the substrate's length direction. Alternatively, as shown in FIG. 12(b), for example, a plurality of drivers 10 (two in FIG. 12(b)), in which the respective faces of substrates 1, having reinforcing members 2 formed thereon, face in the same direction, are provided and connected in series with each other by a connecting member 23c at the end portions of the drivers 10 (the substrates 1 or the reinforcing members 2) in the substrate's length direction. It should be noted that three or more drivers 10 may be provided and connected in parallel or in series with each other. Also, the connecting members 23a, 23b, and 23c are not always necessary, and the substrates 1 or the reinforcing members 2 of the drivers 10 may be directly connected with each other.

In the actuator 11 of this invention, as the width of the substrates 1 is reduced, the widthwise flexural rigidity of the substrates 1 is decreased to increase the amount of displacement. However, if the width of the substrates 1 is reduced too much, the widthwise flexural rigidity of the substrates 1 becomes too low to cause the widthwise resonance characteristics of the substrates 1 to deteriorate. As a result, even if an attempt were made to operate the drivers at high speed by changing the voltages applied to the first and second electrode layers 5 and 6 at high speed, deformation of the substrates would not immediately follow the changes of the voltages, such that the high speed operation of the drivers would be impossible. The operation speed required varies depending upon the device to which the actuator 11 is applied, but it is of course preferable that the amount of displacement be large and the operation speed be high. Therefore, if a plurality of drivers 10 are connected in parallel with each other in the manner described above, the widthwise flexural rigidity of the substrates 1 is increased, while the amount of displacement maintains characteristics similar to those obtained when the width of the substrates 1 is reduced. As a result, high speed movement becomes possible.

Also, as described above, in cases where the first electrode layer 5 is divided into the two individual electrodes 5a and 5b, the tip of the driver 10 of the actuator 11 moves along an arc, which causes operational failures depending on the configuration of the fine motion mechanism. However, as in this embodiment, if a plurality of drivers 10 are connected in parallel with each other and they have the same deformation characteristics, the drivers 10 are not likely to deform in the length direction, whereby the deformation direction is limited only to the substrate's width direction.

The case in which the drivers 10 are connected in series will be described later in detail in a sixth embodiment.

Hereinafter, specific examples of this embodiment will be described.

EXAMPLE 11

FIG. 13(a) illustrates an actuator 11 according to Example 11. The actuator 11 includes two drivers 10, in which the respective faces of substrates 1, on which reinforcing members 2 have been formed, face in the same direction and are arranged in parallel with each other in the substrate's width direction with a separation distance of 200 μm. Each driver 10 is the same in configuration as the drivers of the actuators of Example 9. And these two drivers 10 were connected in parallel with each other by connecting members 23a and 23b at the both end portions of the drivers 10 in the substrate's length direction. The connecting member 23a was formed integral with the substrates 1 of the two drivers 10, while the connecting member 23b was secured to the extension portions of the reinforcing members 2 of the two drivers 10, which were extended toward the connecting member 23b.

The connecting member 23a also functioned as a fixed member, while the connecting member 23b also served as a movable member. Therefore, the drivers 10 of the actuator 11 were operated as they were as a fine motion mechanism. More specifically, when the same amount of voltage was applied to the individual electrodes 5a of the two drivers 10, and the same amount of voltage (which was equal in magnitude, but opposite in polarity, to the voltage applied to the individual electrodes 5a) was also applied to the individual electrodes 5b of the two drivers 10, the end portions of the substrates 1 closer to the connecting member 23b each described an arc as their trajectory, as shown in FIG. 13(b). However, the extended portions of the reinforcing members 2 deformed to cause the connecting member 23b to move along a line in the substrate's width direction.

The connecting member 23b weighed 200 mg, and the amount of bending of each driver 10 in the substrate's thickness direction was 13 μm. Then, a driving test was conducted, in which the same driving voltages as those of Example 1 were applied, while the drive frequency was varied. The amount of movement of the connecting member 23b was ±2.0 μm, and stable operation was possible up to a drive frequency of 700 Hz. Also, the positioning accuracy, the long-term operation characteristics, and the shock-resistance characteristics were the same as those of Example 2.

Therefore, it was found that the drive frequency could be increased in the actuator 11 in which the plurality of drivers 10 were connected in parallel. It was also found that this actuator 11, when used as a fine motion mechanism, enabled the movable member to move along a line.

EXAMPLE 12

Figure 14:
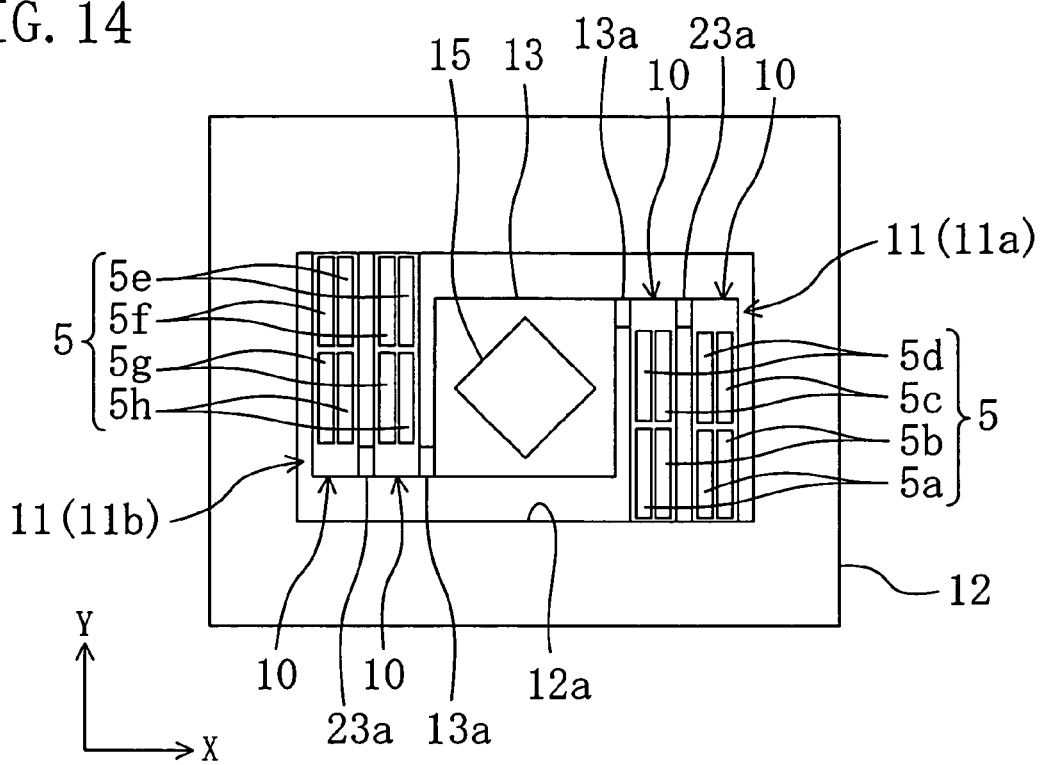
FIG. 14 illustrates an imaging-device fine-motion mechanism for a camera module according to Example 12.

FIG. 14 illustrates an imaging-device fine-motion mechanism for a camera module according to Example 12. In this example, the two actuators 11 (11a, 11b) of Example 10 (see FIG. 10) were each changed so as to include two drivers 10 connected in parallel with each other as shown in FIG. 12(a). In each actuator 11, the distance between the two drivers 10 was 300 μm. In the other respects, such as size, electrode configuration, driving voltage, etc., the drivers 10 of the actuators 11 were the same as those of Example 10.

In this example, a fixed member 12 also functions as a fixed-member-side connecting member. Movable-member-side connecting members 23a each connect the side faces of the two drivers 10 that face each other at lengthwise end portions of the substrates 1. Therefore, the movable member 13 is directly fixed to the substrates 1 of the drivers 10 located closer to the movable member 13, while being indirectly fixed to the substrates 1 of the drivers 10 located away from the movable member 13. The movable member 13 may be fixed to the connecting members 23a. In short, it is sufficient if the movable member 13 is directly or indirectly secured to the two drivers 10.

By the above configuration, the time interval between the beginnings of consecutive image taking times was shortened to 1 ms (1000 Hz), which enabled images to be taken at shorter time intervals, thereby obtaining higher-quality, higher-resolution images.

Sixth Embodiment

Figure 15:
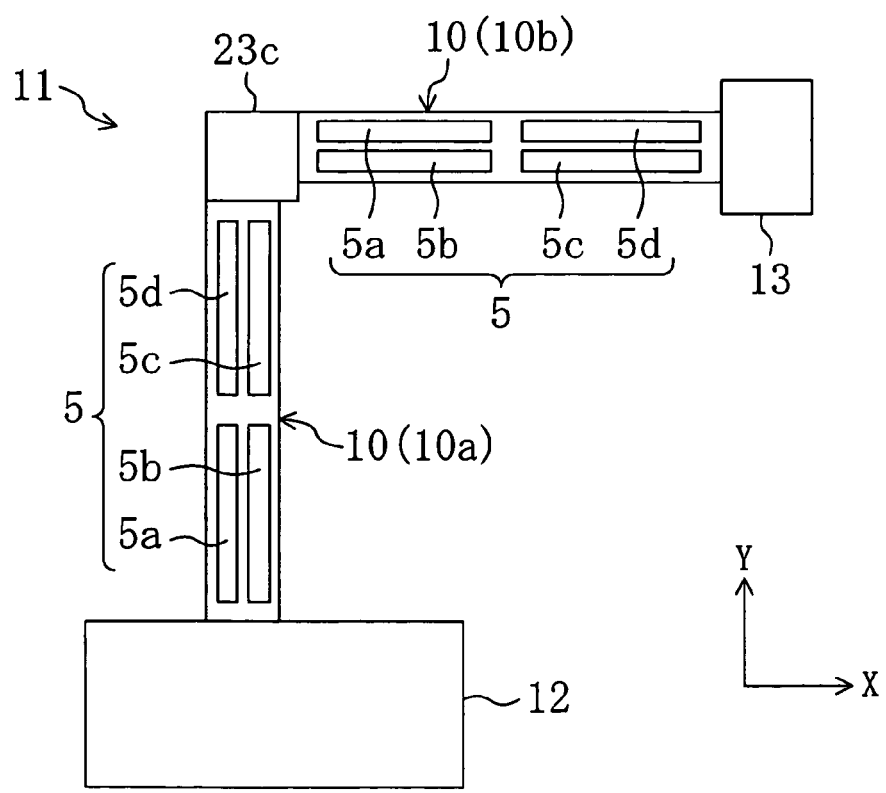
FIG. 15 illustrates a fine motion mechanism according to a sixth embodiment.

FIG. 15 illustrates a fine motion mechanism according to a sixth embodiment of the present invention. The fine motion mechanism includes an actuator 11 having two drivers 10 (in FIG. 15, one of the drivers is represented by the reference numeral 10a, while the other is denoted by the reference numeral 10b) connected with each other in series at their end portions in the substrate's length direction, as shown in FIG. 12(b).

In this embodiment, the two drivers 10 extend in directions perpendicular to each other when viewed from the substrate's thickness direction. The end portion of the one driver 10a away from a connecting member 23c is secured to a fixed member 12, while a movable member 13 is secured to the end portion of the other driver 10b away from the connecting member 23c.

If the two drivers 10, connected in series with each other at their end portions in the substrate's length direction, are not arranged in parallel with each other, it becomes possible to move the movable member 13 two-dimensionally in a certain plane by combining displacements occurring in the drivers 10. As in this embodiment, if the two drivers 10 are connected so as to perpendicularly intersect each other, it is possible to easily control the driving of the movable member 13 in the two axial directions intersecting each other at right angles. More specifically, the movement of the movable member 13 in the X-axis direction can be performed just by controlling the driver 10 (the driver 10a closer to the fixed member) extending in the Y-axis direction, while the movement in the Y-axis direction can be performed just by controlling the driver 10 (the driver 10b closer to the movable member) extending in the X-axis direction.

When the two drivers 10 are connected in series in this manner, the length along the drivers 10, from the fixed member 12 to the movable member 13, is considerably long. Therefore, if each driver 10 is not provided with a reinforcing member 2, the amount of bending of the movable member 13 in the substrate's thickness direction will be increased significantly. However, in this embodiment, the flexural rigidity of each substrate 1 in the thickness direction is increased by the reinforcing member 2, making it possible to effectively suppress displacement of the movable member 13 from the plane in which the movable member 13 should be moved.

In cases in which three or more drivers 10 are connected in series, two adjacent drivers 10 may be extended in directions perpendicularly intersecting each other when viewed from the substrate's thickness direction.

When the fine motion mechanism that moves the movable member 13 in the two orthogonal axial directions as described above is used in a camera module to move an imaging device 13, still higher-resolution images can be obtained.

Figure 16:
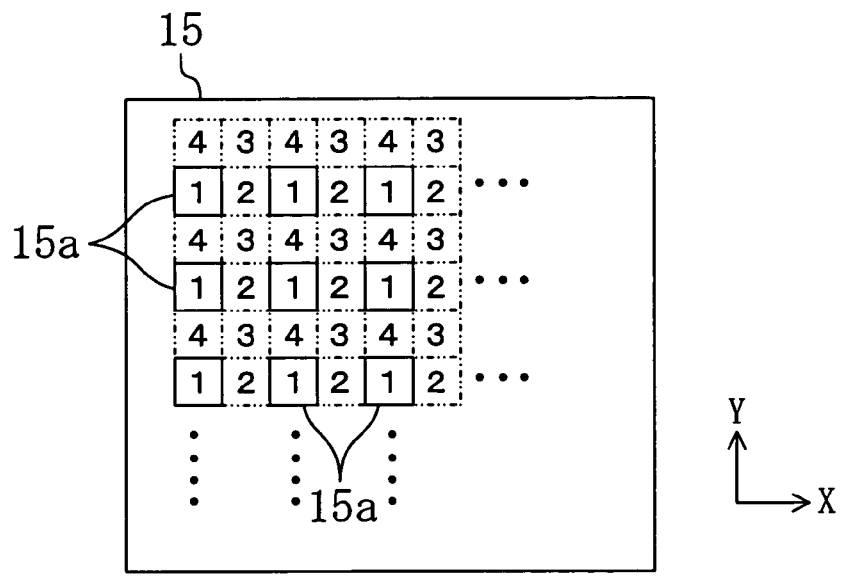
FIG. 16 schematically illustrates how the positions of photoreceptors vary when a high-resolution image having four times as many pixels is obtained by using a fine motion mechanism in which an imaging device is moved in two axial directions intersecting each other at right angles.

FIG. 16 schematically illustrates how the positions of photoreceptors 15a vary when a high-resolution image having four times as many pixels is obtained by using a fine motion mechanism in which a movable member 13 (an imaging device) is moved in two axial directions intersecting each other at right angles. First, an image is captured when the photoreceptors 15a are in the locations indicated by "1" in FIG. 16. Then, the photoreceptors 15a are moved by the fine motion mechanism in the X-axis direction so as to be in the locations indicated by "2" in FIG. 16, and the photoreceptors 15a in the locations "2" capture a second image. Next, the fine motion mechanism moves the photoreceptors 15a in the Y-axis direction, which is perpendicular to the X-axis direction, to the locations indicated by "3" in FIG. 16, and the photoreceptors 15a in the locations "3" capture a third image. Thereafter, the fine motion mechanism moves the photoreceptors 15a in the X-axis direction (in the direction opposite to the movement from "1" to "2") to the locations indicated by "4" in FIG. 16, and the photoreceptors 15a in the locations "4" capture a fourth image. These four images are then synthesized, thereby obtaining a high-resolution image having four times as many pixels. If more detailed control is performed on the positioning of the imaging device, a still higher-resolution image can be obtained.

Figure 17:
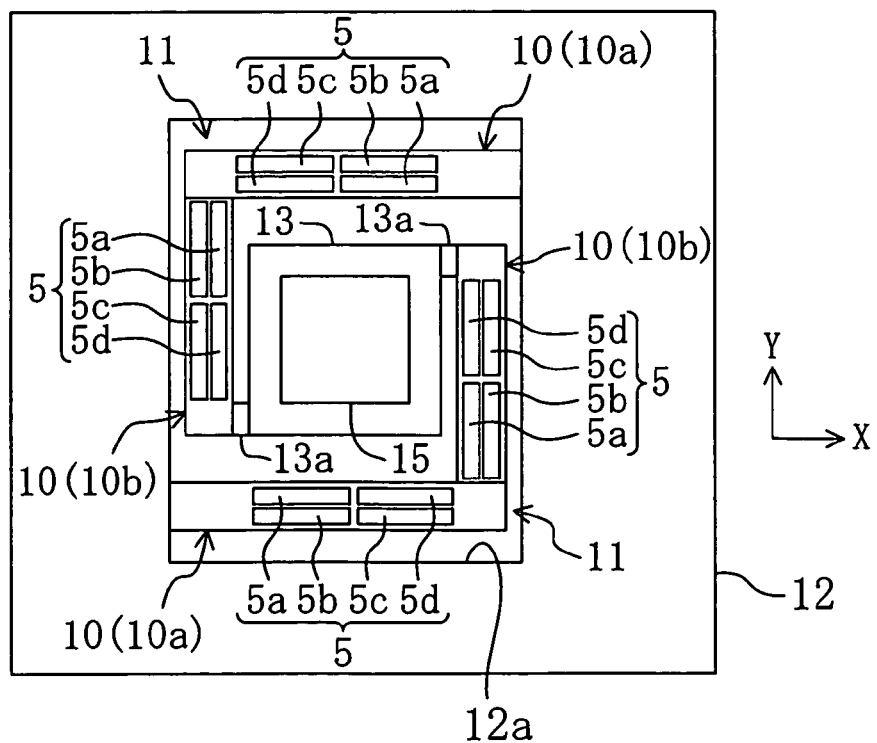
FIG. 17 illustrates an imaging-device fine-motion mechanism for a camera module in which the imaging device can be moved in two axial directions perpendicular to each other.

FIG. 17 illustrates an imaging-device fine-motion mechanism for a camera module in which an imaging device 15 disposed on the upper face of a movable member 13 can be moved with respect to a fixed member 12 (i.e., an optical lens) in two axial directions perpendicular to the optical axis of the optical lens. In this fine motion mechanism, two actuators 11 support and drive the movable member 13 as in Example 10. Like the actuator 11 shown in FIG. 15, each actuator 11 includes two drivers 10 (10a, 10b), which are connected in series so as to extend in orthogonal directions (in this embodiment, substrates 1 are connected directly with each other with no connecting member interposed therebetween). A first electrode layer 5 of each driver 10 is divided into four individual electrodes 5a to 5d in the same manner as described in Example 10.

In each actuator 11, one of the lengthwise end portions of the substrate 1 of the one driver 10a is secured to a fixed member 12 similar to that of Example 10, while to the other end portion, one of the lengthwise end portions of the substrate 1 of the other driver 10b is fixed. To the other lengthwise end portion of the substrate 1 of the other driver 10b, an attachment portion 13a of the movable member 13 is fixedly secured. In each actuator 11, the one driver 10a extends in the X-axis direction shown in FIG. 17, while the other driver 10b extends in the Y-axis direction perpendicular to the one driver 10*a*. The movable member 13 (the imaging device 15) is moved in the Y-axis direction by driving the drivers 10*a*, while the movable member 13 is moved in the X-axis direction by driving the other drivers 10*b*. This allows the movable member 13 to move in the two axial directions, i.e., in the X-axis direction and the Y-axis direction.

In each actuator 11, the two drivers 10*a* and 10*b* are not always required to extend in the directions perpendicular to each other. Even if the two drivers 10*a* and 10*b* do not form a right angle, it is possible to move the movable member 13 in any directions in a certain plane by driving the two drivers 10*a* and 10*b* in cooperation with each other.

Now, specific examples of this embodiment will be described.

EXAMPLE 13

In this example, an imaging-device fine-motion mechanism for a camera module similar to that shown in FIG. 17 was manufactured. Substrates, reinforcing members, a fixed member, and a movable member were formed integral with each other by dry-etching of a silicon substrate as in Example 10. The drivers of each actuator were the same as those of Example 10. The movable member (the imaging device) of this fine motion mechanism was moved in the manner described in FIG. 16 so as to capture four images, and those images were synthesized, thereby obtaining a high-resolution image having four times as many pixels.

EXAMPLE 14

Figure 18:
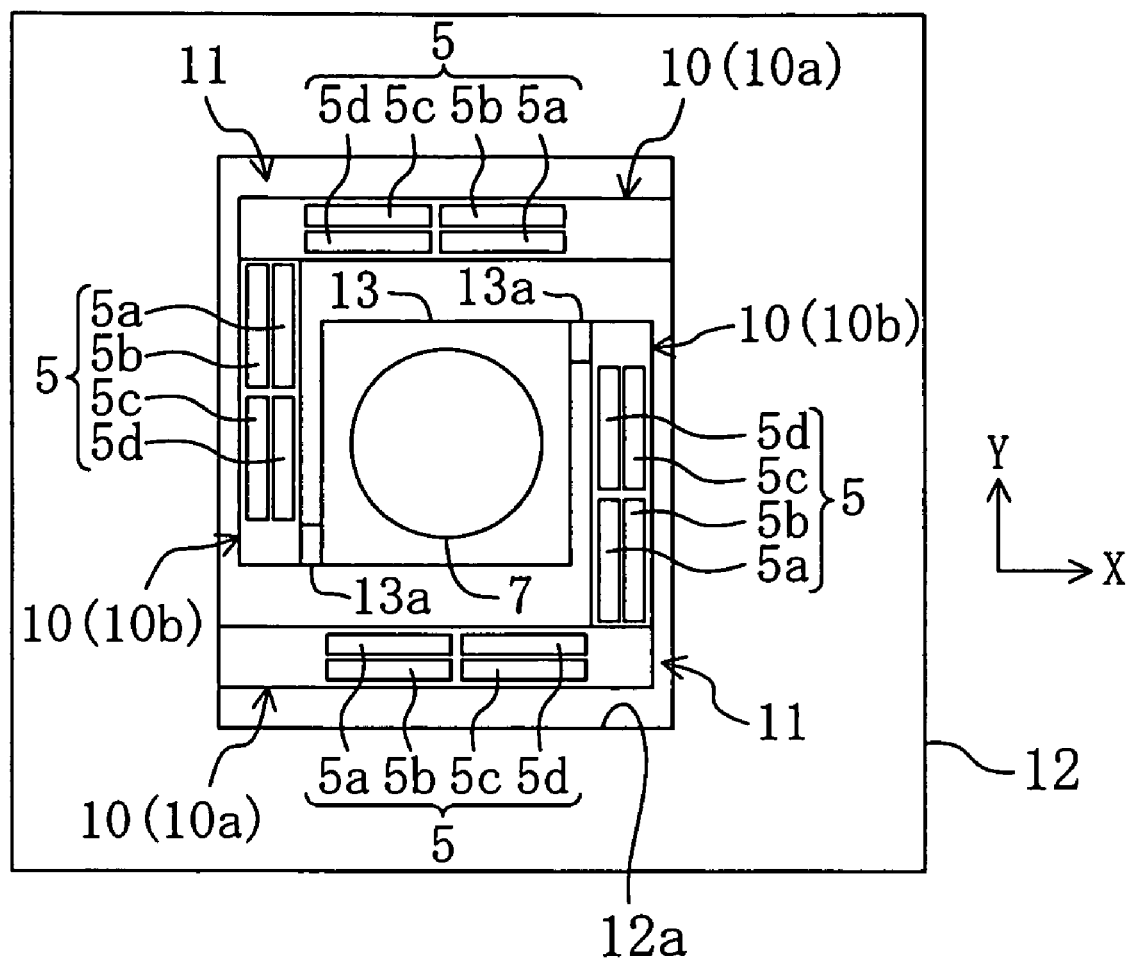
FIG. 18 illustrates an optical-lens fine-motion mechanism for a camera module according to Example 14.

FIG. 18 illustrates an optical-lens fine-motion mechanism for a camera module according to Example 14. In this example, not an imaging device but an optical lens was moved.

More specifically, a movable member 13 is made of material having light transmitting property, and an optical lens 7 is secured to this movable member 13. The optical axis of the optical lens 7 extends in the direction perpendicular to the paper of FIG. 18. An imaging device having photoreceptors for receiving light passing through the optical lens 7 is disposed behind the optical lens 7, i.e., on the backside of the paper of FIG. 18 and indirectly secured to a fixed member 12. In the other respects, the configuration of the fine motion mechanism was the same as that of Example 12, and the fine motion mechanism was constructed so as to obtain a high-resolution image having four times as many pixels by moving the optical lens 7 with respect to the fixed member 12 (i.e., the imaging device) in the two axial directions (the X-axis direction and the Y-axis direction in FIG. 18) perpendicular to the optical axis of the optical lens 7. Since the weight of the optical lens 7 was about one tenth of the weight of the imaging device, the driving power for the actuators was smaller as compared to cases in which the imaging device is moved. Therefore, it was possible to operate the optical lens 7 at higher speed and hence increase the quality of images further.

EXAMPLE 15

Figure 19:
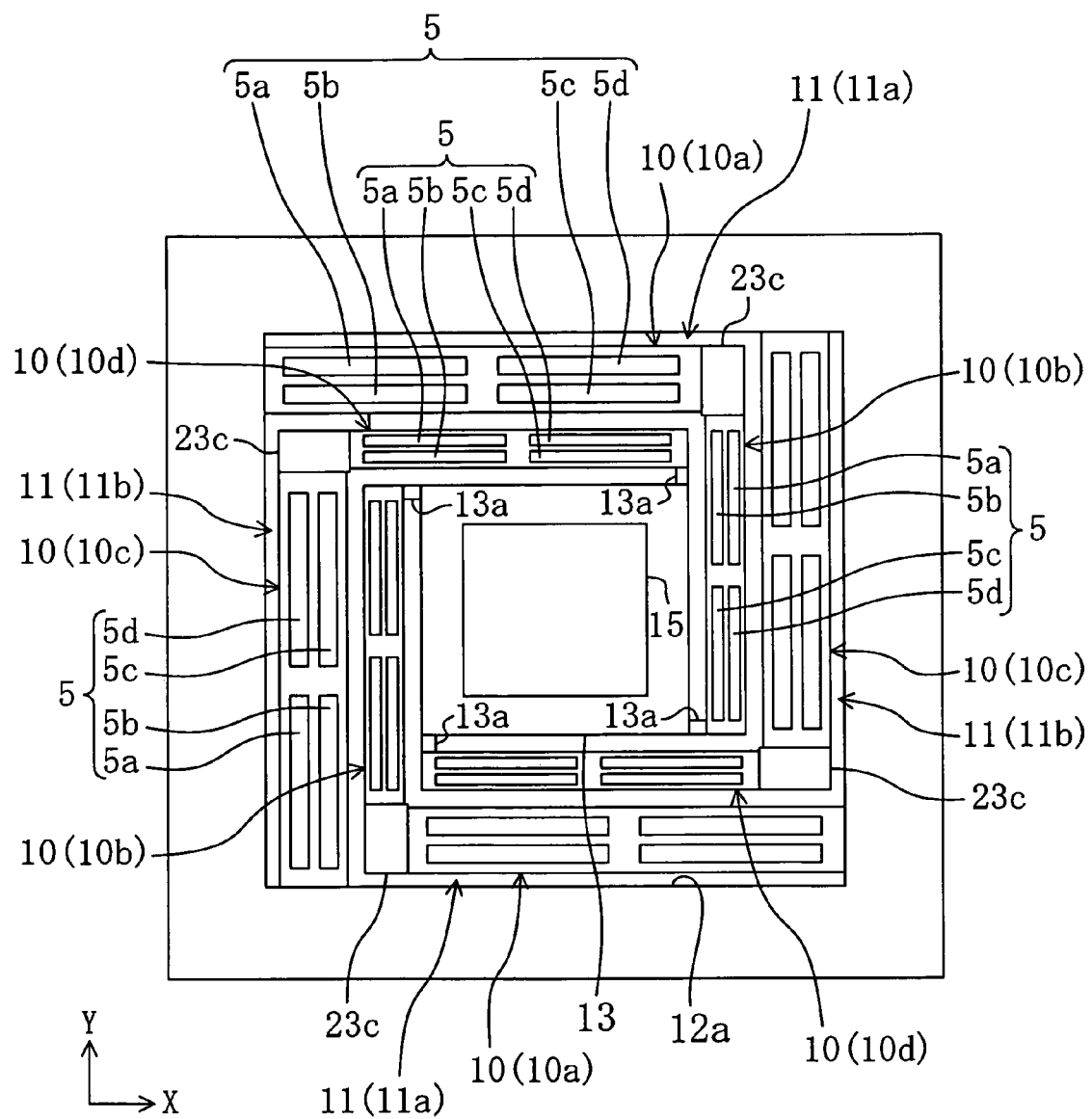
FIG. 19 illustrates an imaging-device fine-motion mechanism for a camera module according to Example 15.

FIG. 19 illustrates an imaging-device fine-motion mechanism for a camera module according to Example 15. In this example, the fine motion mechanism is constructed using four actuators 11 having the same structure as the actuator 11 of the sixth embodiment. More specifically, the fine motion mechanism includes two actuators 11*a* and two actuators 11*b*, and each actuator 11*a* has drivers 10*a* and 10*b* and each actuator 11*b* has drivers 10*c* and 10*d*. Each driver 10*a* is located close to a fixed member and extends in the X-axis direction, each driver 10*b* is located close to a movable member and extends in the Y-axis direction, each driver 10*c* is located close to the fixed member and extends in the Y-axis direction, and each driver 10*d* is located close to the movable member and extends in the X-axis direction. In order to move the movable member 13 (the imaging device) in the X-axis direction, the drivers 10*b* of the two actuators 11*a* and the drivers 10*c* of the two actuators 11*b* are moved in cooperation with each other, while in order to move the movable member 13 in the Y-axis direction, the drivers 10*a* of the two actuators 11*a* and the drivers 10*d* of the two actuators 11*b* are moved in cooperation with each other.

In this example, in order to make the area of a through-hole 12*a* in the fixed member 12 as small as possible and thereby reduce the entire size of the fine motion mechanism, the substrates 1 in the fixed-member-side drivers 10*a* and 10*c* and the substrates 1 in the movable-member-side drivers 10*b* and 10*d* are different in length and width. More specifically, the substrates 1 of the drivers 11*a* and 11*c* have a length of 10 mm and a width of 800 µm, while the substrates 1 of the drivers 11*b* and 11*d* have a length of 9 mm and a width of 400 µm.

The above-described configuration allowed the movable member 13 to move ±1.0 µm both in the X-axis direction and in the Y-axis direction. While the fine motion mechanism was moved with the pixel pitch of the imaging device being 4 µm, four images were taken, whereby a high-resolution image having four times as many pixels was obtained.

Seventh Embodiment

Figure 20:
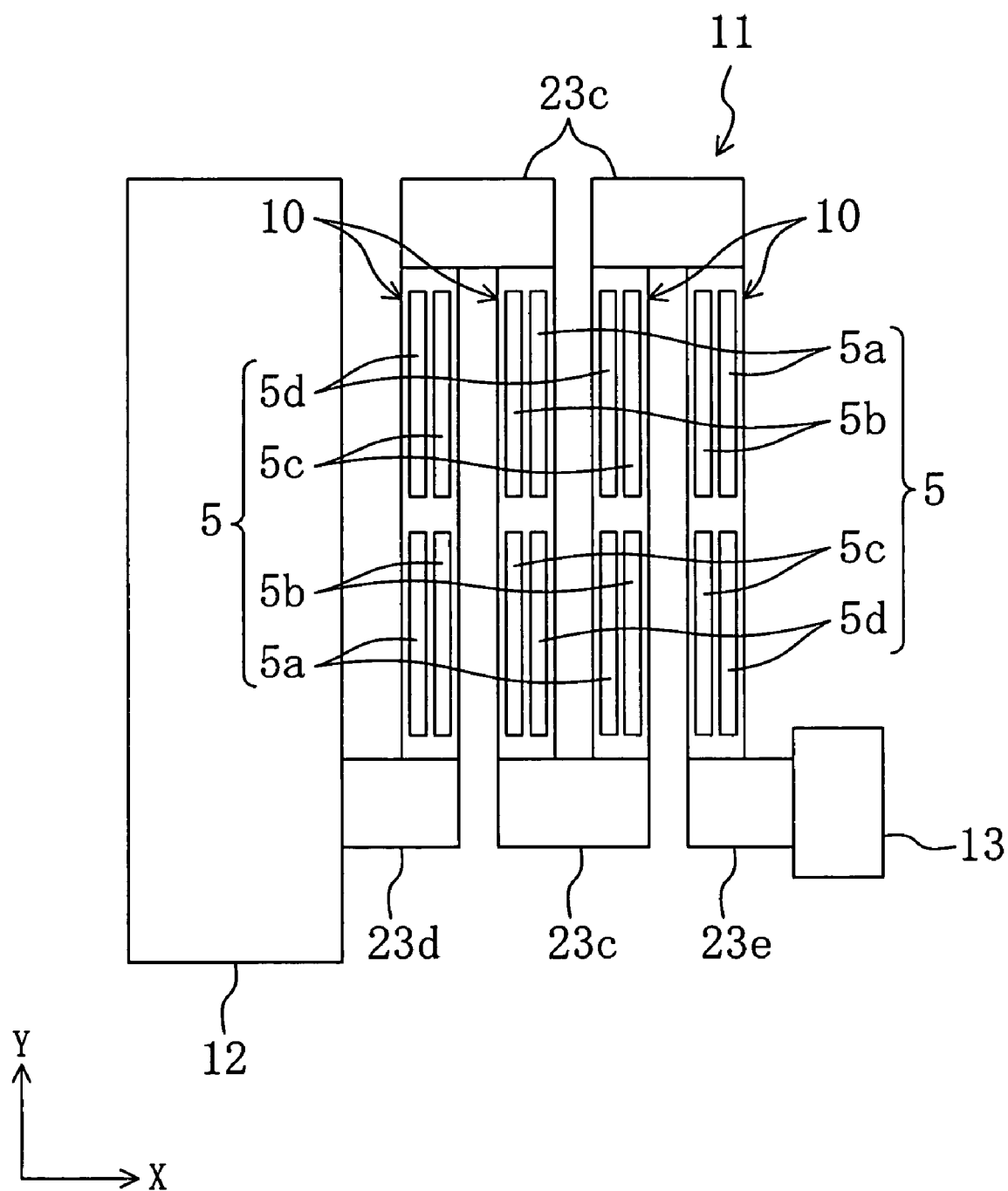
FIG. 20 illustrates the configuration of a fine motion mechanism according to a seventh embodiment.

FIG. 20 illustrates the configuration of a fine motion mechanism according to a seventh embodiment of the present invention. An actuator 11 in this fine motion mechanism is particularly suitable for a hand-shake-caused-blurring correction mechanism for moving the imaging device, the optical lens, and the like so as to cancel hand-shake detected by an angular velocity sensor.

To be specific, if the movable member 13 moves ±2.5 µm, pixel shifting such as described above can be performed sufficiently. However, in the case of a hand-shake-caused-blurring correction mechanism, the amount of movement corresponding to ten pixels of the imaging device (20 µm, when the imaging device has a pixel pitch of 2 µm) is required. Therefore, in this embodiment, the actuator 11 includes a plurality of (four in FIG. 20) drivers 10 so as to increase the amount of movement of the movable member 13, and these drivers 10 are connected in series with each other by connecting members 23*c* at the end portions of the drivers 10 in the substrate's length direction as described in the fifth embodiment, in such a manner that the respective faces of substrates 1, on which reinforcing members 2 have been formed, face in the same direction and are arranged in parallel with each other in the substrate's width direction. One of the endmost drivers 10 is secured at one end portion thereof which is not connected with the adjacent driver 10 to a fixed member 12, while the movable member 13 is fixed to one end portion of the other endmost driver 10 which is not connected to the adjacent driver 10. In this embodiment, the one endmost driver 10 and the fixed member 12 are connected and secured to each other by a connecting member 23*d*, which is similar to the connecting members 23*c* for connecting two adjacent drivers 10, while the other endmost driver 10 and the movable member 13 are also connected and secured to each other by a connecting member 23*e*.

By the above configuration, the drivers 10 are operated in cooperation with each other so as to expand and contract like an accordion, whereby the amount of movement of the movable member 13 in the X-axis direction becomes equal to the total amount of displacements of all drivers 10 in the substrate's width direction, thereby enabling the amount of movement of the movable member 13 to be increased significantly.

Since the width of each driver 10 is small as compared with the total length of all drivers 10, it is difficult to operate the movable member 13 at high speed as described in the fifth embodiment. However, generally, when hand-shake-caused blurring is corrected, the operation of the movable member 13 may be slower as compared to when pixel shifting is performed. Therefore, it is sufficient if the movable member 13 is operated by voltage having a frequency of about 100 Hz.

Figure 21:
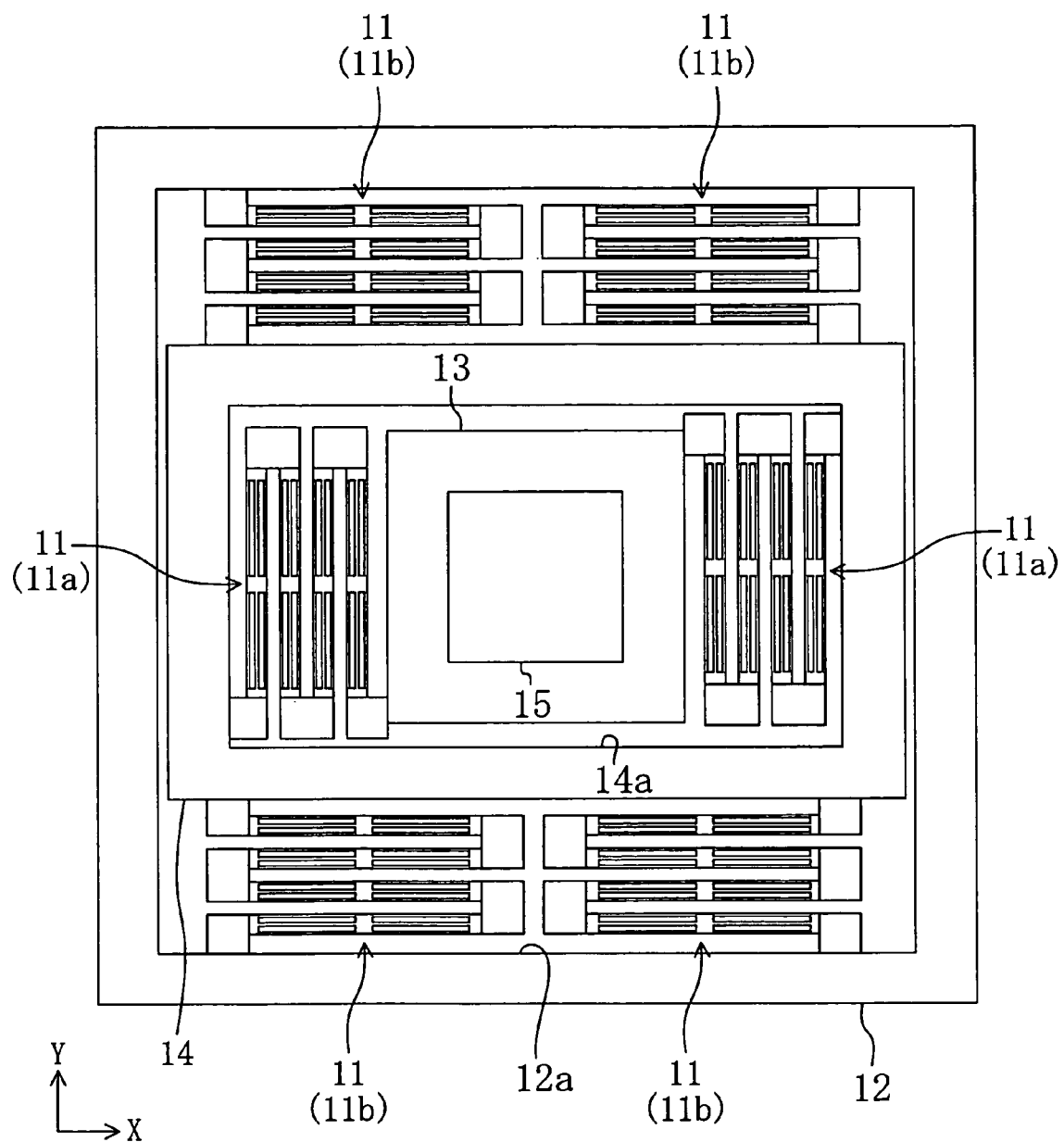
FIG. 21 illustrates an imaging-device fine-motion mechanism for a camera module, which includes actuators in the fine motion mechanism shown in FIG. 20.

FIG. 21 illustrates an imaging-device fine-motion mechanism for a camera module, in which six actuators 11 in the fine motion mechanism shown in FIG. 20 are used. This fine motion mechanism includes a movable member 13, an intermediate member 14, and the six actuators 11 disposed in a through-hole 12a in a fixed member 12. The movable member 13 includes an imaging device 15 similar to that of the fine motion mechanism of FIG. 17, and is disposed in a through-hole 14a formed in the center of the intermediate member 14. Of the six actuators 11, two (these two actuators are represented by reference numeral 11a in FIG. 21) are used to move the movable member 13 in the X-axis direction in FIG. 21. The remaining four (these four actuators are represented by reference numeral 11b in FIG. 21) are used to move the movable member 13 in the Y-axis direction in FIG. 21.

More specifically, in the through-hole 14a, the actuators 11a are disposed respectively at the both ends of the movable member 13 in the X-axis direction. In each actuator 11a, one of the endmost drivers 10 is fixed to an inner face of the through-hole 14a of the intermediate member 14, while to the other endmost driver 10, the movable member 13 is fixed. Therefore, for the actuators 11a, the intermediate member 14 functions like the fixed member 12 of the fine motion mechanism shown in FIG. 20.

In the through-hole 12a, the actuators 11b are disposed so that at each outer side of the intermediate member 14 in the Y-axis direction, two of them are present. In each actuator 11b, one of the endmost drivers 10 is fixed to an inner surface of the through-hole 12a of the fixed member 12, while to the other endmost driver 10, the intermediate member 14 is secured. Therefore, for the actuators 11b, the intermediate member 14 functions like the movable member 13 of the fine motion mechanism of FIG. 20.

The movable member 13 is moved with respect to the intermediate member 14 in the X-axis direction by operating the drivers 10 of the two actuators 11a, while the intermediate member 14 is moved with respect to the fixed member 12 in the Y-axis direction by operating the drivers 10 of the four actuators 11b. It is thus possible to move the movable member 13 (the imaging device 15) with respect to the fixed member 12 (i.e., the optical lens) in the two axial directions (the X-axis direction and the Y-axis direction) perpendicular to the optical axis of the optical lens by operating the drivers 10 of the six actuators 11 in cooperation with each other. Since the amount of movement of the movable member 13 (the imaging device 15) is considerably large as described above, blurring caused by hand-shake detected by an angular velocity sensor can be corrected by moving the movable member 13 in such a manner that the hand-shake is canceled.

EXAMPLE 15

In this example, fine-motion-mechanism actuators similar to that of FIG. 20 were fabricated. In each actuator, the substrate of each driver had a length of 10 mm, a width of 500 μm, and a thickness of 50 μm. Each reinforcing member had a height of 200 μm, a width of 50 μm, and a length of 10 mm. Each of the four individual electrodes of each first electrode layer had a length of 4.5 mm and a width of 220 μm. In the other respects, each driver is the same as that of Example 2.

In the one driver, a voltage of −5V was applied to two individual electrodes located respectively at the two vertices of opposite angles of the rectangle, while a voltage of +5V was applied to the other two individual electrodes. As a result, with respect to one of the lengthwise ends of the substrate, the other lengthwise end was displaced 2.5 μm in the direction of width of the substrate. When the polarity of the applied voltages was reversed, a displacement of 2.5 μm in the opposite direction was observed. In other words, the one driver enabled the movable member to move 5 μm. Therefore, in a fine motion mechanism constructed using an actuator in which four drivers of this configuration are connected as shown in FIG. 20, positioning of the movable member can be performed freely within a 20 μm square region in a certain plane by application of a voltage of +5V or −5V to the four individual electrodes of each driver.

Moreover, a fine motion mechanism for a camera module similar to that shown in FIG. 21 was constructed using six actuators of the above configuration. When an angular velocity sensor detected the amount of hand-shake and this fine motion mechanism performed the hand-shake-caused-blurring correction operation, the hand-shake-caused blurring was corrected excellently, thereby obtaining a high-quality image.

INDUSTRIAL APPLICABILITY

The actuators of the present invention effectively function in a fine motion mechanism provided in a camera module to move an imaging device or an optical lens for pixel-shifting or hand-shake-caused blurring correction. The inventive actuators also function effectively, e.g., as a mechanism for performing fine positioning of a hard-disk read head or an optical-disk read head, or as a driving mechanism for a micromirror and a microshutter.

The invention claimed is:

1. An actuator which includes a driver including: a substrate having a predetermined width and a predetermined length when viewed from a thickness direction of the substrate; a reinforcing member provided on one of the thickness-wise faces of the substrate; and displacement means, provided on the other thickness-wise face of the substrate, for displacing, with respect to one of the lengthwise ends of the substrate, the other lengthwise end in a width direction of the substrate, wherein the reinforcing member is configured so that the flexural rigidity thereof in the substrate's width direction is lower than that in the substrate's thickness direction.

2. The actuator of claim 1, wherein on the one thickness-wise face of the substrate, the reinforcing member is provided continuously in a length direction of the substrate.

3. The actuator of claim 1, wherein the reinforcing member is provided on the one thickness-wise face of the substrate in approximately the center in the width direction.

4. The actuator of claim 1, wherein the reinforcing member is made of metal material.

5. The actuator of claim 4, wherein the reinforcing member is made of plating material.

6. The actuator of claim 5, wherein a nucleation-facilitating-material containing layer is formed between the reinforcing member and the substrate, the nucleation-facilitating-material containing layer containing material for facilitating, when the reinforcing member is formed of plating on the substrate, nucleation for growth of the plating.

7. The actuator of claim 4, wherein the periphery of the driver except for the reinforcing member is covered with non-metallic material.

8. The actuator of claim 1, wherein the substrate is made of metal material.

9. The actuator of claim 1, wherein the reinforcing member is formed integral with the substrate.

10. The actuator of claim 1, wherein when an average value of the dimension of the reinforcing member in the substrate's width direction is $\alpha$ times an average value of the width of the substrate, and an average value of the dimension of the reinforcing member in the substrate's thickness direction is $\beta$ times an average value of the thickness of the substrate, the values of $\alpha$ and $\beta$ satisfy all of the following expressions:

$0.05 < \alpha < 0.45,$ $1 < \beta < 10,$ and $0.001 < \alpha^3 \beta < 0.1.$

11. The actuator of claim 1, wherein the width of the substrate is made to be from more than one to not more than twenty times the thickness of the substrate, and
the length of the substrate is made to be equal to, or more than, four times the width of the substrate.

12. The actuator of claim 1, wherein the displacement means includes a piezoelectric layer, a first electrode layer provided on one of the thickness-wise faces of the piezoelectric layer, and a second electrode layer provided on the other thickness-wise face of the piezoelectric layer; and
at least one of the first and second electrode layers is divided into two or more individual electrodes so that electric fields for displacing the other lengthwise end of the substrate with respect to the one lengthwise end in the width direction of the substrate can be applied to the piezoelectric layer.

13. The actuator of claim 12, wherein at least one of the first and second electrode layers is divided into four or more individual electrodes.

14. The actuator of claim 12, wherein all of the individual electrodes have substantially the same surface area.

15. The actuator of claim 12, wherein at least one of the first and second electrode layers is divided into two individual electrodes which are arranged in the substrate's width direction; and
an electric field applied to a portion of the piezoelectric layer that corresponds to one of the two individual electrodes, and an electric field applied to a portion of the piezoelectric layer that corresponds to the other individual electrode are different in magnitude.

16. The actuator of claim 12, wherein at least one of the first and second electrode layers is divided into four individual electrodes, which are arranged two by two in the substrate's width direction and in the substrate's length direction so as to be respectively located at the vertices of a rectangle when viewed from the thickness direction of the substrate; and
electric fields applied to portions of the piezoelectric layer that correspond to two of the individual electrodes located respectively at two vertices of opposite angles of the rectangle are equal in magnitude to each other, and electric fields applied to portions of the piezoelectric layer that correspond to the other two individual electrodes located respectively at the other two vertices are also equal in magnitude to each other.

17. The actuator of claim 16, wherein the magnitude of the electric fields applied to the portions of the piezoelectric layer that correspond to the two of the individual electrodes located respectively at the two vertices of the opposite angles of the rectangle is different from the magnitude of the electric fields applied to the portions of the piezoelectric layer that correspond to the other two individual electrodes located respectively at the other two vertices.

18. The actuator of claim 1, comprising a plurality of drivers in which faces of substrates, on which reinforcing members have been provided, face in the same direction and are arranged in parallel with each other in the substrates' width direction,
wherein the plurality of drivers are connected in parallel with each other at their both end portions in the substrates' length direction.

19. The actuator of claim 1, comprising a plurality of drivers in which faces of substrates, on which reinforcing members have been provided, face in the same direction,
wherein the plurality of drivers are connected in serial with each other at their end portions in the substrates' length direction.

20. The actuator of claim 19, wherein two adjacent drivers extend in directions perpendicular to each other when viewed from the substrates' thickness direction.

21. The actuator of claim 19, wherein the plurality of drivers, which are arranged in parallel with each other in the substrates' width direction, are connected in series with each other at their end portions in the substrates' length direction via a connecting member.

22. A fine motion mechanism which includes an actuator including a driver for moving a movable member with respect to a fixed member,
wherein the driver of the actuator includes a substrate having a predetermined width and a predetermined length when viewed from a thickness direction of the substrate; a reinforcing member provided on one of the thickness-wise faces of the substrate; and displacement means, provided on the other thickness-wise face of the substrate, for displacing, with respect to one of the lengthwise ends of the substrate, the other lengthwise end in a width direction of the substrate;
the reinforcing member is configured so that the flexural rigidity thereof in the substrate's width direction is lower than that in the substrate's thickness direction;
one end portion of the driver in the substrate's length direction is secured to the fixed member, while to the other end portion, the movable member is secured; and
the driver is configured so as to move the movable member with respect to the fixed member in the substrate's width direction by operating the displacement means.

23. A camera module which includes an imaging device, an optical lens for guiding light to the imaging device, and an actuator including a driver for moving the imaging device or the optical lens in a direction perpendicular to the optical axis of the optical lens,
wherein the driver of the actuator includes a substrate having a predetermined width and a predetermined length when viewed from a thickness direction of the substrate;

a reinforcing member provided on one of the thickness-wise faces of the substrate; and displacement means, provided on the other thickness-wise face of the substrate, for displacing, with respect to one of the lengthwise ends of the substrate, the other lengthwise end in a width direction of the substrate;

the reinforcing member is configured so that the flexural rigidity thereof in the substrate's width direction is lower than that in the substrate's thickness direction;

one end portion of the driver in the substrate's length direction is secured to a fixed member, while to the other end portion, the imaging device or the optical lens is secured; and the driver is configured so as to move the imaging device or the optical lens with respect to the fixed member in a direction perpendicular to the optical axis of the optical lens by operating the displacement means.

* * * * *